(12) United States Patent
Uochi

(10) Patent No.: US 8,634,230 B2
(45) Date of Patent: Jan. 21, 2014

(54) SEMICONDUCTOR DEVICE AND METHOD FOR DRIVING THE SAME

(75) Inventor: Hideki Uochi, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 30 days.

(21) Appl. No.: 13/348,950

(22) Filed: Jan. 12, 2012

(65) Prior Publication Data
US 2012/0194262 A1 Aug. 2, 2012

(30) Foreign Application Priority Data
Jan. 28, 2011 (JP) ................................. 2011-016957

(51) Int. Cl.
*G11C 11/34* (2006.01)
(52) U.S. Cl.
USPC ...................................... 365/150; 365/230.03
(58) Field of Classification Search
USPC ............................................ 365/150, 230.03
See application file for complete search history.

(56) References Cited

U.S. PATENT DOCUMENTS

| | | | |
|---|---|---|---|
| 4,466,081 A | 8/1984 | Masuoka | |
| 4,656,607 A | 4/1987 | Hagiwara et al. | |
| 4,839,863 A * | 6/1989 | Soneda | 365/154 |
| 5,280,446 A | 1/1994 | Ma et al. | |
| 5,731,856 A | 3/1998 | Kim et al. | |
| 5,744,864 A | 4/1998 | Cillessen et al. | |
| 6,294,274 B1 | 9/2001 | Kawazoe et al. | |
| 6,538,916 B2 | 3/2003 | Ohsawa | |
| 6,563,174 B2 | 5/2003 | Kawasaki et al. | |
| 6,576,943 B1 | 6/2003 | Ishii et al. | |
| 6,670,679 B2 | 12/2003 | Hirata | |
| 6,687,152 B2 | 2/2004 | Ohsawa | |

(Continued)

FOREIGN PATENT DOCUMENTS

| | | |
|---|---|---|
| EP | 0 053 878 A2 | 6/1982 |
| EP | 1 237 193 A2 | 9/2002 |

(Continued)

OTHER PUBLICATIONS

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

(Continued)

*Primary Examiner* — Michael Tran
(74) *Attorney, Agent, or Firm* — Fish & Richardson P.C.

(57) ABSTRACT

Data is written in the following manner: potentials of first and second control gates of a transistor are set at a potential for making a storage gate of the transistor a conductor, a potential of data to be stored is supplied to the storage gate, and at least one of the potentials of the first and second control gates is set at a potential for making the storage gate an insulator. Data is read in the following manner: the potential of the second control gate is set at a potential for making the storage gate an insulator; a potential is supplied to a wiring connected to one of a source and a drain of the transistor; then, a potential for reading is supplied to the first control gate to detect a change in the potential of a bit line connected to the other of the source and the drain.

26 Claims, 10 Drawing Sheets

(56) References Cited

U.S. PATENT DOCUMENTS

| | | |
|---|---|---|
| 6,727,522 B1 | 4/2004 | Kawasaki et al. |
| 6,876,023 B2 | 4/2005 | Ishii et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,115,941 B2 | 10/2006 | Kato |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,550,334 B2 | 6/2009 | Kato et al. |
| 7,674,650 B2 | 3/2010 | Akimoto et al. |
| 7,732,819 B2 | 6/2010 | Akimoto et al. |
| 2001/0046027 A1 | 11/2001 | Tai et al. |
| 2002/0017692 A1 | 2/2002 | Shimizu et al. |
| 2002/0056838 A1 | 5/2002 | Ogawa |
| 2002/0100926 A1 | 8/2002 | Kim et al. |
| 2002/0110018 A1 | 8/2002 | Ohsawa |
| 2002/0132454 A1 | 9/2002 | Ohtsu et al. |
| 2003/0039146 A1 | 2/2003 | Choi |
| 2003/0112659 A1 | 6/2003 | Ohsawa |
| 2003/0151948 A1 | 8/2003 | Bhattacharyya |
| 2003/0189401 A1 | 10/2003 | Kido et al. |
| 2003/0218222 A1 | 11/2003 | Wager, III et al. |
| 2003/0231528 A1 | 12/2003 | Choi et al. |
| 2004/0014284 A1 | 1/2004 | Kim et al. |
| 2004/0038446 A1 | 2/2004 | Takeda et al. |
| 2004/0084710 A1 | 5/2004 | Baker et al. |
| 2004/0127038 A1 | 7/2004 | Carcia et al. |
| 2005/0017302 A1 | 1/2005 | Hoffman |
| 2005/0095786 A1 | 5/2005 | Chang et al. |
| 2005/0199959 A1 | 9/2005 | Chiang et al. |
| 2005/0205921 A1 | 9/2005 | Ishii et al. |
| 2006/0035452 A1 | 2/2006 | Carcia et al. |
| 2006/0038218 A1 | 2/2006 | Yaegashi et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0284234 A1 | 12/2006 | Hsieh et al. |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0248622 A1 | 10/2008 | Matamis et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0268596 A1 | 10/2008 | Pham et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0212340 A1 | 8/2009 | Lee et al. |
| 2009/0278122 A1 | 11/2009 | Hosono et al. |
| 2009/0280600 A1 | 11/2009 | Hosono et al. |
| 2009/0283812 A1 | 11/2009 | Asami |
| 2010/0032668 A1 | 2/2010 | Yamazaki et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0317500 A1 | 12/2011 | Uochi et al. |
| 2012/0026787 A1 | 2/2012 | Uochi et al. |

FOREIGN PATENT DOCUMENTS

| | | |
|---|---|---|
| EP | 1 737 044 A1 | 12/2006 |
| EP | 2 226 847 A2 | 9/2010 |
| JP | 57-105889 A | 7/1982 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-246571 A | 8/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| WO | 2004/114391 A1 | 12/2004 |

OTHER PUBLICATIONS

Asaoka, Yet al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

(56) References Cited

OTHER PUBLICATIONS

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., "Optical Studies of the Amorphous Liquid—Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTs," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTs) for AMLCDS," Journal of the SID, 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda., T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "SPINEL,YbFe2O4, and Yb2Fe3O7 Types of Structures for Compounds in the In2O3 and SC2O3-A2O3-BO Systems [A; Fe, Ga, or Al; B: Mg, Mn, Fe, Ni, Cu,or Zn] at Temperatures Over 1000° C.," Journal of Solid State Chemistry, 1985, vol. 60, pp. 382-384.

Kimizuka, N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits, 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "SUFTLA Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3—Ga2ZnO4—ZnO system at 1350° C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics), 2006, vol. 45, No. 5B, pp. 4303-4308.

(56) References Cited

OTHER PUBLICATIONS

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters), Sep. 13, 2004, vol. 85, No. 11, pp. 1993-1995.

Nowatari, H et al., "60.2: Intermediate Connector With Suppressed Voltage Loss for White Tandem OLEDs," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In—Ga—Zn—Oxide TFTs With a Novel Passivation Layer," SID Digest '09 : SID International Symposium Digest of Technical Papers, May 31, 2009, pp. 284-287.

Ohara, H et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci, Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium—Gallium—Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In—Ga—Zn—Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3—In2O3—ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 with Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

\* cited by examiner

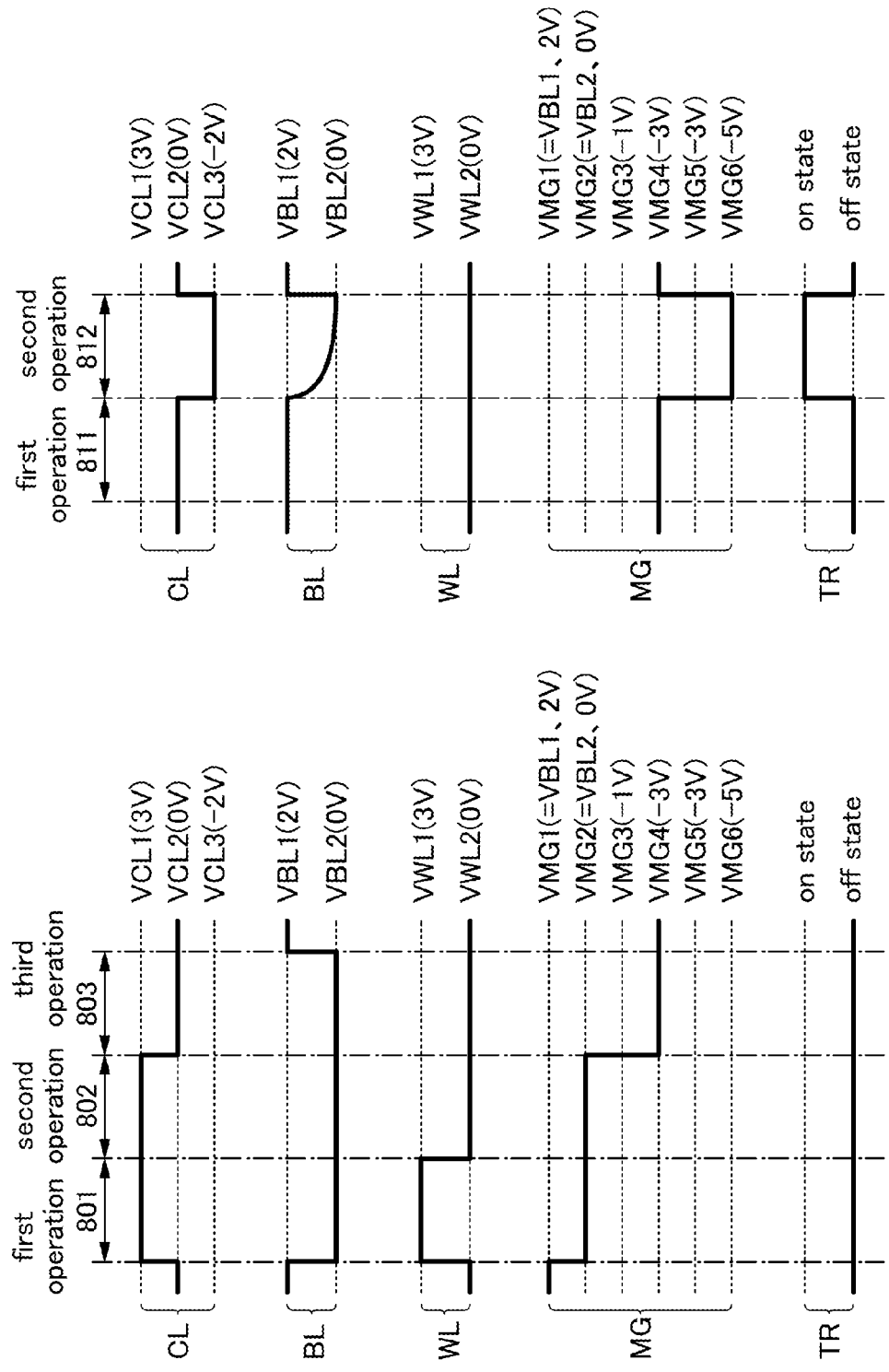

SEMICONDUCTOR DEVICE AND METHOD FOR DRIVING THE SAME

BACKGROUND OF THE INVENTION

1. Field of the Invention

The invention disclosed herein relates to a semiconductor device using a semiconductor element, a method for manufacturing the semiconductor device, and a method for driving the semiconductor device.

In this specification, a semiconductor device refers to any device that can function by utilizing semiconductor properties. A semiconductor circuit, a storage device, an imaging device, a display device, an electro-optical device, an electronic device, and the like are all semiconductor devices.

2. Description of the Related Art

Storage devices using semiconductor elements are broadly classified into two categories: a volatile device that loses stored data when power supply stops, and a non-volatile device that retains stored data even when power is not supplied.

A typical example of a volatile storage device is DRAM (dynamic random access memory). DRAM stores data (information) in such a manner that a transistor included in a storage element is selected and charge is stored in a capacitor.

When data is read from DRAM, charge in a capacitor is lost on the above principle; thus, another write operation is necessary every time data is read. Moreover, a transistor included in a storage element has a leakage current and charge flows into or out of a capacitor even when the transistor is not selected, so that the data retention time is short. For that reason, another write operation (refresh operation) is necessary at predetermined intervals, and it is difficult to sufficiently reduce power consumption of the storage element. Furthermore, since stored data is lost when power supply stops, an additional storage device using a magnetic material or an optical material is needed in order to hold the data for a long time.

Another example of a volatile storage device is SRAM (static random access memory). SRAM retains data by using a circuit such as a flip-flop and thus does not need a refresh operation. This means that SRAM has an advantage over DRAM. However, cost per storage capacity is increased because of the use of a flip-flop or the like. Moreover, as in DRAM, stored data in SRAM is lost when power supply stops.

A typical example of a non-volatile storage device is a flash memory. A flash memory includes a floating gate between a gate electrode and a channel formation region in a transistor and stores data by holding charge in the floating gate. Therefore, a flash memory has advantages in that the data retention time is extremely long (almost permanent) and a refresh operation which is necessary in a volatile storage device is not needed (e.g., see Patent Document 1).

However, a gate insulating layer included in a storage element deteriorates by tunneling current generated in writing, so that the storage element stops its function after a limited number of write operations. In order to reduce adverse effects of this problem, a method of equalizing the number of write operations for storage elements is employed, for example, in which case a complicated peripheral circuit is needed. Moreover, employing such a method does not solve the problem of lifetime. In other words, a flash memory is not suitable for applications in which data is frequently rewritten.

In addition, high voltage is necessary to inject charge in the floating gate or to remove the charge, and a circuit for generating high voltage is also necessary. Further, it takes a relatively long time to inject or remove charge, so that it is not easy to increase the speed of write and erase operations.

REFERENCE

Patent Document 1: Japanese Published Patent Application No. S57-105889

SUMMARY OF THE INVENTION

In view of the foregoing problems, an object of one embodiment of the invention disclosed herein is to provide a semiconductor device with a novel structure in which stored data can be retained even when power is not supplied and there is no limitation on the number of write cycles.

Another object is to provide a semiconductor device with high degree of integration and large storage capacity.

Another object is to provide a highly reliable semiconductor device with high stability in operation.

Another object is to provide a semiconductor device capable of high-speed operation.

Still another object is to provide a semiconductor device with low power consumption.

Each embodiment of the invention disclosed in this specification achieves at least one of the above objects.

A storage gate containing an oxide semiconductor is provided in a transistor. The storage gate is made to be n-type (to be a conductor), and a specific potential is supplied to the storage gate. After that, the storage gate is made to be an insulator to hold the potential (charge).

According to one embodiment of the present invention, a semiconductor device includes a transistor including a first gate, a second gate, a third gate, and a semiconductor layer including a channel formation region; and a bit line. The third gate includes a first region overlapping with the first gate and the channel formation region, and a second region extending beyond an edge of the first gate and overlapping with the second gate. The second region is electrically connected to the bit line.

The first gate and the second gate function as control gates. The third gate functions as a storage gate. The third gate is formed using an oxide semiconductor. The third gate is made to be a conductor or an insulator depending on potentials supplied to the first gate and the second gate.

According to another embodiment of the present invention, a semiconductor device includes a transistor including a first control gate, a second control gate, a storage gate, and a semiconductor layer including a channel formation region; a control line; a bit line; and a word line. The first control gate is electrically connected to the control line. The second control gate is electrically connected to the word line. The storage gate is electrically connected to the bit line. One of a source and a drain of the transistor is electrically connected to the bit line. The other of the source and the drain of the transistor is electrically connected to the word line. The storage gate includes a first region overlapping with the first control gate and the channel formation region, and a second region extending beyond an edge of the first control gate and overlapping with the second control gate.

As a semiconductor for forming a channel of the transistor, an amorphous semiconductor or a crystalline semiconductor such as a single crystal semiconductor, a polycrystalline semiconductor, or a microcrystalline semiconductor can be used, for example. Examples of a semiconductor material are silicon, germanium, silicon germanium, silicon carbide, and gallium arsenide. Alternatively, an oxide semiconductor material may be used as a semiconductor for forming a channel of the transistor.

The storage gate is formed using an oxide semiconductor. As the oxide semiconductor used for the storage gate, an i-type (intrinsic) or substantially i-type oxide semiconductor is preferably used. An i-type oxide semiconductor (including an oxide semiconductor that becomes i-type by application of an electric field) has a sufficiently low carrier density (of lower than $1 \times 10^{12}/cm^3$, preferably lower than $1.45 \times 10^{10}/cm^3$), and thus serves as an insulator.

An oxide semiconductor used for the storage gate is not necessarily an i-type (intrinsic) or substantially intrinsic oxide semiconductor, and any oxide semiconductor that can become i-type by application of an electric field can be used.

Data can be stored in the following manner: a potential of data to be stored is applied to the oxide semiconductor used for the storage gate when the oxide semiconductor is made to serve as a conductor by application of an electric field, and the potential is held by making at least part of the oxide semiconductor i-type (making the oxide semiconductor an insulator).

The storage gate is placed to overlap with the channel formation region in the semiconductor layer included in the transistor.

In the above semiconductor device, data is written in the following manner: the potentials of the first control gate and the second control gate are set at a potential for making the storage gate a conductor, a potential to be stored in a memory cell is supplied to the storage gate, and at least one of the potentials of the first control gate and the second control gate is set at a potential for making the storage gate an insulator.

In the above semiconductor device, data is read in the following manner: one of the source and the drain of the transistor is supplied (precharged) with charge until one of the source and the drain has a first potential, the other of the source and the drain of the transistor is supplied with a second potential, the first control gate is supplied with a potential for reading data, and a change in the potential of the one of the source and the drain or a change in current value between the source and the drain is detected.

Note that in this specification and the like, a non-volatile semiconductor device indicates a semiconductor device that can retain data for a given period of time (at least $1 \times 10^4$ seconds or longer, preferably $1 \times 10^6$ seconds or longer) even when no power is supplied.

According to one embodiment of the present invention, the area of a semiconductor device can be reduced; thus, a semiconductor device with higher integration and larger storage capacity can be provided.

In addition, a problem such as deterioration of a gate insulating layer hardly occurs because data writing does not need high voltage; thus, the number of write cycles and the reliability are greatly increased.

Further, an operation for erasing data is not needed, so that high-speed operation can be easily achieved.

Data is stored by making an oxide semiconductor an insulator, so that the stored data can be retained for an extremely long time. In other words, a refresh operation becomes unnecessary or the frequency of refresh operations can be extremely low; consequently, power consumption of the semiconductor device can be reduced. Moreover, stored data can be retained for a long time even when power is not supplied.

BRIEF DESCRIPTION OF THE DRAWINGS

In the accompanying drawings:
FIGS. 3A and 3B are timing charts illustrating operations of a semiconductor device.

DETAILED DESCRIPTION OF THE INVENTION

Figure 1A:
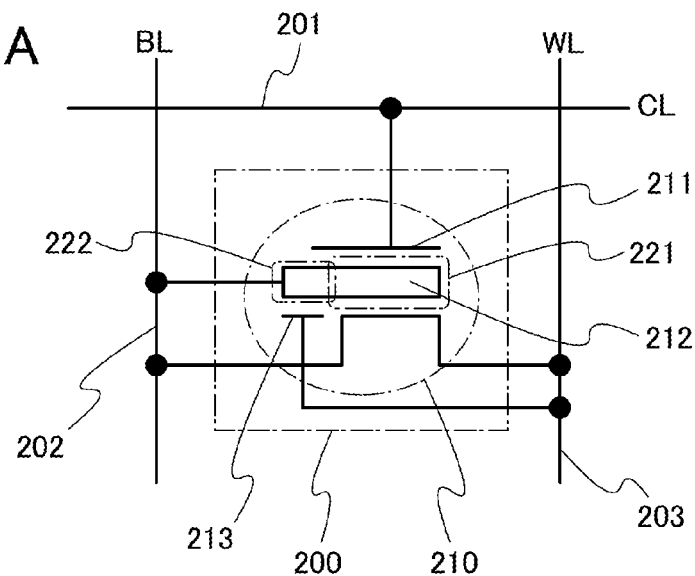
FIGS. 1A and 1B are each a circuit diagram of a semiconductor device.

Examples of embodiments of the present invention will be described below with reference to the accompanying drawings. Note that the present invention is not limited to the description below, and it is easily understood by those skilled in the art that modes and details can be changed in various ways without departing from the spirit and scope of the present invention. Therefore, the present invention should not be construed as being limited to the following description of the embodiments.

Note that the position, size, range, and the like of each component illustrated in drawings and the like are not accurately represented in some cases for easy understanding. Therefore, the disclosed invention is not necessarily limited to the position, size, range, and the like disclosed in the drawings and the like. In the drawings for explaining the embodiments, the same portions or portions having a similar function are denoted by the same reference numerals, and description of such portions is not repeated.

In this specification and the like, ordinal numbers such as first, second, and third are used in order to avoid confusion among components, and the terms do not limit the number of components.

In addition, in this specification and the like, the terms "electrode" and "wiring" do not have functional limitations. For example, an "electrode" is sometimes used as part of a "wiring", and vice versa. Furthermore, the term "electrode" or "wiring" sometimes refers to a plurality of "electrodes" or "wirings" formed in an integrated manner.

Functions of a "source" and a "drain" are sometimes replaced with each other when a transistor of opposite polarity is used or when the direction of current flowing is changed in circuit operation, for example. Therefore, the terms "source" and "drain" can be replaced with each other in this specification.

Note that in this specification and the like, the term "electrically connected" includes the case where components are connected through an object having any electric function. There is no particular limitation on an object having any electric function as long as electric signals can be transmitted and received between components that are connected through the object.

Examples of the object having any electric function are a switching element such as a transistor, a resistor, an inductor, a capacitor, and an element with a variety of functions as well as an electrode and a wiring.

Note that a voltage refers to a difference between potentials of two points, and a potential refers to electrostatic energy (electric potential energy) of a unit charge at a given point in an electrostatic field. Note that in general, a difference between a potential of one point and a reference potential (e.g., a ground potential) is merely called a potential or a voltage, and "potential" and "voltage" are used as synonymous words in many cases. Therefore, in this specification, "potential" can be replaced with "voltage" and vice versa, unless otherwise specified.

A transistor is one of a variety of semiconductor elements, and can amplify current or voltage and perform a switching operation for controlling conduction and non-conduction, for example. A transistor in this specification includes an insulated-gate field effect transistor (IGFET) and a thin film transistor (TFT) in its category.

Embodiment 1

In this embodiment, an example of a circuit configuration and an operation of a semiconductor device according to one embodiment of the disclosed invention will be described with reference to FIGS. 1A and 1B, FIGS. 2A to 2C, FIGS. 3A and 3B, and FIG. 4. In this embodiment, the case where a p-channel transistor (p-type transistor) is used will be described.

FIG. 1A illustrates a circuit configuration of a memory cell 200 including a transistor 210. The transistor 210 has a first control gate 211, a storage gate 212, and a second control gate 213. In FIG. 1A, the first control gate 211 of the transistor 210 is electrically connected to a first wiring 201 (also referred to as a control line CL). The storage gate 212 of the transistor 210 is electrically connected to a second wiring 202 (also referred to as a bit line BL). The second control gate 213 of the transistor 210 is electrically connected to a third wiring 203 (also referred to as a word line WL). The second wiring 202 is electrically connected to one of a source and a drain of the transistor 210. The other of the source and the drain of the transistor 210 is electrically connected to the third wiring 203.

The storage gate 212 includes a first region 221 that overlaps with the first control gate 211 and a channel formation region of the transistor 210, and a second region 222 that extends beyond the edge of the first control gate 211 and overlaps with the second control gate 213. The first region 221 is electrically connected to the second wiring 202 (the bit line BL) through the second region 222. Part of the first control gate 211 and part of the second control gate 213 overlap with each other with part of the storage gate 212 sandwiched therebetween.

As a semiconductor for forming a channel of the transistor 210, an amorphous semiconductor or a crystalline semiconductor such as a single crystal semiconductor, a polycrystalline semiconductor, or a microcrystalline semiconductor can be used, for example. Examples of a semiconductor material are silicon, germanium, silicon germanium, silicon carbide, and gallium arsenide. The transistor 210 including such a semiconductor material can operate at sufficiently high speed, so that stored data can be read at high speed, for example. In other words, high-speed operation of the semiconductor device can be achieved.

Alternatively, an oxide semiconductor can be used as a semiconductor for forming the channel of the transistor 210. An oxide semiconductor has a wide energy gap of 3.0 eV or more. In a transistor obtained by processing an oxide semiconductor under appropriate conditions, the leakage current between a source and a drain in the off state per 1 μm of channel width at an operating temperature (e.g., at 25° C.) can be 100 zA ($1\times10^{-19}$ A) or lower or 10 zA ($1\times10^{-20}$ A) or lower, and further can be 1 zA ($1\times10^{-21}$ A) or lower. Thus, a semiconductor device with lower power consumption can be provided.

The storage gate 212 is formed using an oxide semiconductor. It is known that there are an oxide semiconductor that becomes n-type when an electric field is applied and an oxide semiconductor that becomes p-type when an electric field is applied. In this specification, as an example of an oxide semiconductor used for the storage gate 212, a description is given of an oxide semiconductor that is i-type (intrinsic) or substantially i-type when no electric field is applied and becomes n-type when a certain amount of electric field is applied.

Alternatively, an oxide semiconductor used for the storage gate 212 can be an oxide semiconductor that can become i-type or substantially i-type by application of an electric field. Note that the i-type (intrinsic) or substantially i-type oxide semiconductor is i-type without application of an electric field; therefore, in the case of using such an oxide semiconductor, circuit design can be easy and a semiconductor device with lower power consumption can be manufactured.

Figure 2A:
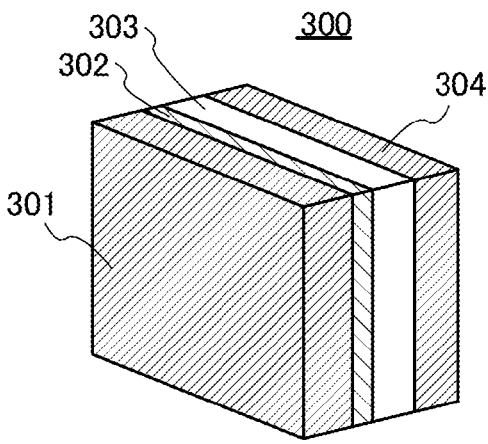
FIGS. 2A to 2C are diagrams explaining transient current characteristics of a capacitor containing an oxide semiconductor.

Here, measurement results of transient current characteristics of a capacitor 300 that includes a stack of an insulator and an oxide semiconductor as a dielectric will be described with reference to FIGS. 2A to 2C. FIG. 2A is a schematic diagram illustrating a stacked structure of the measured capacitor 300.

The capacitor 300 includes an oxide semiconductor 302 and an insulator 303 between an electrode 301 and an electrode 304. The electrode 301 is in contact with the oxide semiconductor 302. The electrode 304 is in contact with the insulator 303. As the oxide semiconductor 302, an oxide semiconductor of In—Ga—Zn-based oxide with a thickness of 30 nm was used. As the insulator 303, 100-nm-thick silicon oxide was used. The overlap area of the electrode 301 and the electrode 304 was 1 mm$^2$.

The transient current was measured with Agilent 4156C Precision Semiconductor Parameter Analyzer (manufactured by Agilent Technologies, Inc.). The measurement was performed as follows. First, the value of a current flowing between the electrode 301 and the electrode 304 was measured for 60 seconds while the potential of the electrode 301 is set at 0 V and the potential of the electrode 304 is set at 2V. Then, the value of a current flowing between the electrode 301 and the electrode 304 was measured for 60 seconds while the potential of the electrode 301 is set at 0 V and the potential of the electrode 304 is set at −2 V.

Figure 2B:
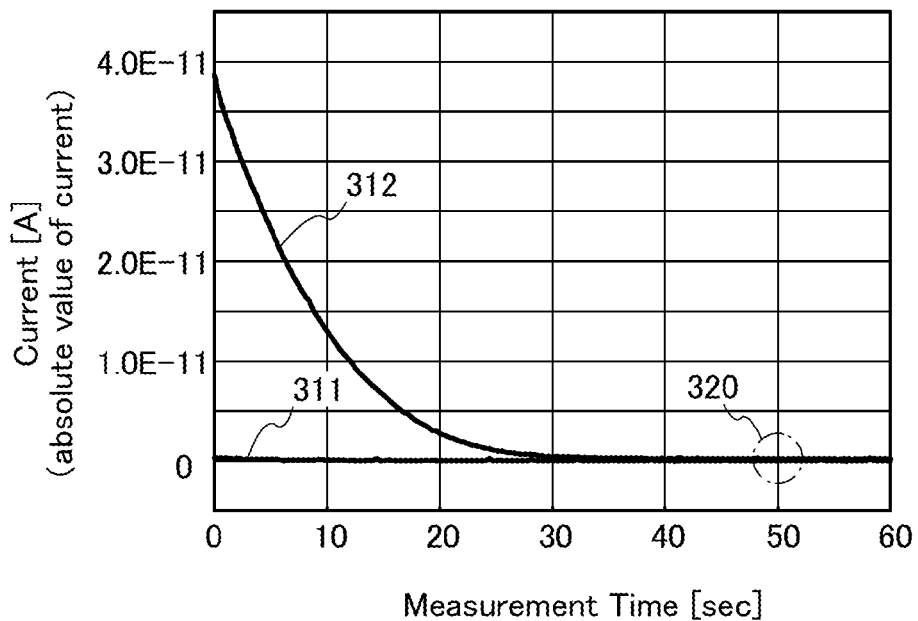
Figure 2C:
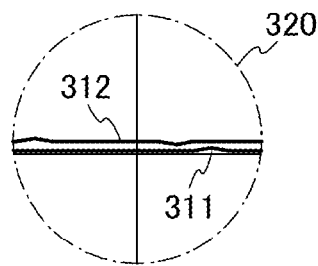

FIG. 2B shows the measurement results of the transient current. In FIG. 2B, the horizontal axis represents voltage application time (measurement time), and the vertical axis represents the absolute value of current flowing between the electrode 301 and the electrode 304. A curve 311 in FIG. 2B represents a change in the value of current flowing between the electrode 301 and the electrode 304 when a voltage of 2 V is applied to the electrode 304. A curve 312 represents a change in the value of current flowing between the electrode 301 and the electrode 304 when a voltage of −2 V is applied to the electrode 304.

It is understood from the curves 311 and 312 that almost no current flows between the electrode 301 and the electrode 304 when a voltage of 2 V is applied to the electrode 304, and then, when a voltage of −2 V is applied to the electrode 304, a current which is apparently larger in amount than that in the case where a voltage of 2 V is applied to the electrode 304 flows between the electrode 301 and the electrode 304 for approximately 30 seconds after starting application of −2 V. FIG. 2C is an enlarged view of a portion 320 in FIG. 2B. From FIG. 2C, the current value of the curve 312 is higher than that of the curve 311 even after 50 seconds have passed.

The following consideration is obtained from the measurement results of the transient current. When a voltage of 2 V is applied to the electrode 304, a positive electric field is applied to the oxide semiconductor 302 through the insulator 303, and the oxide semiconductor 302 becomes n-type. The n-type oxide semiconductor 302 is supplied with charge from the electrode 301 and functions as a conductor; thus, only the insulator 303 serves as a dielectric layer in the capacitor 300, and almost no current flows between the electrode 301 and the electrode 304.

Then, when a voltage of −2 V is applied to the electrode 304, the oxide semiconductor 302 becomes i-type. At this time, charge in the oxide semiconductor 302 and near the interface between the electrode 301 and the oxide semiconductor 302 moves toward the electrode 301 immediately. On the other hand, charge in the oxide semiconductor 302 and away from the electrode 301 cannot move immediately but moves slowly because of effects of electric field drift caused by application of −2 V to the electrode 304.

A general i-type semiconductor such as silicon becomes n-type when a positive electric field is applied and becomes p-type when a negative electric field is applied. That is, such a semiconductor serves as a conductor when an electric field is applied. On the other hand, an oxide semiconductor that is used for the storage gate 212 described in this specification becomes n-type when a positive electric field is applied but remains i-type when a negative electric field is applied.

The oxide semiconductor has a wide energy gap of 3.0 eV or more. The i-type (intrinsic) or substantially i-type oxide semiconductor has a sufficiently low carrier density (e.g., lower than $1 \times 10^{12}/cm^3$, preferably lower than $1.45 \times 10^{10}/cm^3$) as compared to the carrier density of a general silicon wafer (approximately $1 \times 10^{14}/cm^3$). Accordingly, unlike a general semiconductor such as silicon, the i-type or substantially i-type oxide semiconductor can be substantially regarded as an insulator.

It is therefore likely that an oxide semiconductor can be either a conductor or an insulator in accordance with an electric field applied thereto and charge applied when the oxide semiconductor serves as a conductor can be retained even after the oxide semiconductor becomes an insulator.

Using the above properties of the oxide semiconductor, it is possible to provide a highly reliable storage element in which writing and reading of data can be performed at high speed with low voltage.

In addition, the use of the above properties of the oxide semiconductor makes it possible to achieve a non-volatile storage element that can retain stored data without supply of power.

Next, an example of a write operation (write mode) and a read operation (read mode) for storing binary data (e.g., data of 0 or 1) in the semiconductor device disclosed in this embodiment will be described with reference to timing charts of FIGS. 3A and 3B. The timing charts of FIGS. 3A and 3B show changes over time in potentials or states of the components illustrated in FIG. 1A. In this embodiment, a description is given of an operation of storing a potential VBL1 or a potential VBL2 in the memory cell 200 as binary data and an operation of reading the stored data.

In this embodiment, the potential that makes the oxide semiconductor used for the storage gate 212 a conductor (n-type) (hereinafter such a potential is also referred to as $Vth_{OS}$) is 1 V. That is, the storage gate 212 becomes a conductor (n-type) when the potential of the first control gate 211 is higher than that of the storage gate 212 by 1 V or more, and becomes an insulator when the difference between the potentials of the first control gate 211 and the storage gate 212 is less than 1 V. Specifically, the second region 222 included in the storage gate 212 becomes a conductor (n-type) when the potential of the second control gate 213 is higher than that of the second wiring 202 by 1 V or more. Further, the first region 221 included in the storage gate 212 becomes a conductor (n-type) when the potential of the first control gate 211 is higher than that of the second wiring 202 by 1 V or more while the second region 222 is a conductor (n-type).

Moreover, in this embodiment, the threshold voltage of the transistor 210 (represented as TR in FIGS. 3A and 3B) which is a p-channel transistor is −7 V (the threshold voltage is also referred to as $Vth_{TR}$). That is, assuming that the potential of the source is 0 V, the transistor 210 is turned on when a voltage applied to the gate is −7 V or lower and is turned off when the voltage is higher than −7 V.

First, potentials applied to each component will be described. The first wiring 201 (the control line CL) is supplied with a potential VCL1, a potential VCL2, and a potential VCL3. The potential VCL1 is a potential for writing data into the first region 221 (represented as MG in FIGS. 3A and 3B) included in the storage gate 212. The potential VCL2 is a potential for holding data written into the first region 221. The potential VCL3 is a potential for reading data held in the first region 221.

In this embodiment, the potential VCL1, the potential VCL2, and the potential VCL3 are 3 V, 0 V, and −2 V, respectively.

The second wiring 202 (the bit line BL) is supplied with the potential VBL1 and the potential VBL2. The potential VBL1 and the potential VBL2 are potentials supplied to the storage gate 212 at the time of the write operation, and correspond to data to be stored in the first region 221. Further, the potential VBL1 and the potential VBL2 are potentials for turning off the transistor 210.

In this embodiment, the potential VBL1 is higher than the potential VBL2; the potential VBL1 and the potential VBL2 are 2 V and 0 V, respectively.

Note that in consideration of the relation with the potential supplied to the bit line BL and $Vth_{OS}$, the potential supplied to the control line CL is set so that Formulae 1 to 4 are satisfied.

$$VCL1 \geq Vth_{os} + VBL1 \qquad \text{[Formula 1]}$$

$$VCL1 \geq Vth_{os} + VBL2 \qquad \text{[Formula 2]}$$

$$VCL2 < Vth_{os} + VBL1 \qquad \text{[Formula 3]}$$

$$VCL2 < Vth_{os} + VBL2 \qquad \text{[Formula 4]}$$

Formulae 1 and 2 are conditional expressions for making the first region 221a conductor at the time of data writing. Formulae 3 and 4 are conditional expressions for making the first region 221 an insulator.

The third wiring 203 (the word line WL) is supplied with a potential VWL1 and a potential VWL2. The potential VWL1 is a potential for making the second region 222 included in the storage gate 212 a conductor. The potential VWL2 is a potential for making the second region 222 included in the storage gate 212 an insulator.

In this embodiment, the potential VWL1 and the potential VWL2 are 3 V and 0 V, respectively.

Note that in consideration of the relation with the potential supplied to the bit line BL, $Vth_{OS}$, and $Vth_{TR}$, the potential supplied to the word line WL is set so that Formulae 5 to 8 are satisfied.

$$VWL1 \geq Vth_{os} + VBL1 \quad \text{[Formula 5]}$$

$$VWL1 \geq Vth_{os} + VBL2 \quad \text{[Formula 6]}$$

$$VWL2 < Vth_{os} + VBL1 \quad \text{[Formula 7]}$$

$$VWL2 < Vth_{os} + VBL2 \quad \text{[Formula 8]}$$

Formulae 5 and 6 are conditional expressions for making the second region 222 a conductor at the time of data writing. Formulae 7 and 8 are conditional expressions for making the second region 222 an insulator.

In consideration of the relation with a potential VMG3 and a potential VMG4 which are described below and $Vth_{TR}$, the potential supplied to the word line WL is set so that Formulae 9 to 12 are satisfied.

$$VWL1 < VMG3 - Vth_{TR} \quad \text{[Formula 9]}$$

$$VWL1 < VMG4 - Vth_{TR} \quad \text{[Formula 10]}$$

$$VWL2 < VMG3 - Vth_{TR} \quad \text{[Formula 11]}$$

$$VWL2 < VMG4 - Vth_{TR} \quad \text{[Formula 12]}$$

Formulae 9 to 12 are conditional expressions for preventing the transistor 210 from being turned on by a change in the potential of the word line WL during a data retention time.

In the first region 221 included in the storage gate 212, a potential VMG1, a potential VMG2, the potential VMG3, the potential VMG4, a potential VMG5, or a potential VMG6 is held in accordance with the potentials of the first wiring 201 (the control line CL) and the second wiring 202 (the bit line BL). The potential VMG1 and the potential VMG2 are potentials supplied from the second wiring 202 (the bit line BL) at the time of the write operation. The potential VMG1 corresponds to the potential VBL1, and the potential VMG2 corresponds to the potential VBL2. That is, the potential VMG1 and the potential VMG2 are 2 V and 0 V, respectively, in this embodiment.

The potential VMG3 and the potential VMG4 are potentials at the time when the potential of the first wiring 201 (the control line CL) is the potential VCL2. The potential VMG3 is a potential obtained by adding the potential VMG1 to a value determined by subtracting the potential VCL1 from the potential VCL2. The potential VMG4 is a potential obtained by adding the potential VMG2 to a value determined by subtracting the potential VCL1 from the potential VCL2. That is, the potential VMG3 and the potential VMG4 are −1 V and −3 V, respectively, in this embodiment.

The potential VMG5 and the potential VMG6 are potentials at the time of the read operation. The potential VMG5 is a potential obtained by adding the potential VMG1 to a value determined by subtracting the potential VCL1 from the potential VCL3. The potential VMG6 is a potential obtained by adding the potential VMG2 to a value determined by subtracting the potential VCL1 from the potential VCL3. That is, the potential VMG5 and the potential VMG6 are −3 V and −5 V, respectively, in this embodiment.

Note that the potential VMG5 and the potential VMG6 need to be set to satisfy Formulae 13 and 14. For that reason, the potential VCL3 for reading is preferably set to satisfy Formula 15.

$$VMG5 > Vth_{TR} \quad \text{[Formula 13]}$$

$$VMG6 \leq Vth_{TR} \quad \text{[Formula 14]}$$

$$VCL3 = Vth_{TR} + VCL1 - \frac{VBL1 - VBL2}{2} \quad \text{[Formula 15]}$$

Formula 13 is a conditional expression for turning off the transistor 210 when the potential VCL3, which is the potential for reading, is applied to the control line CL. Formula 14 is a conditional expression for turning on the transistor 210.

In the above manner, the potential VBL1 (the potential VMG1) supplied to the first region 221 is changed to the potential VMG3 or the potential VMG5 in accordance with the potential of the first wiring 201 (the control line CL). Similarly, the potential VBL2 (the potential VMG2) supplied to the first region 221 is changed to the potential VMG4 or the potential VMG6 in accordance with the potential of the first wiring 201 (the control line CL).

By detecting the state of the transistor 210 at the time when the potential VCL3 is applied to the control line CL, which binary data is stored in the storage gate 212 can be detected.

The insulated storage gate 212 is electrically floating (in a floating state). Thus, the potential of the insulated storage gate 212 is varied in accordance mainly with a change in the potential of the first wiring 201 (the control line CL), the second wiring 202 (the bit line BL), or the third wiring 203 (the word line WL).

For example, the amount of change in the potential of the first region 221 is determined mainly by the ratio of a capacitance (hereinafter "$C_{CM}$") generated between the first control gate 211 and the first region 221 to a capacitance (hereinafter "$C_{MS}$") generated between the storage gate 212 and the channel formation region of the transistor 210.

When the value of $C_{CM}$ is made larger than that of $C_{MS}$, the potential of the insulated first region 221 is varied substantially in accordance with the change in the potential of the first control gate 211, that is, the first wiring 201 (the control line CL) but is not likely to be affected by the change in the potentials of the second wiring 202 (the bit line BL) and the third wiring 203 (the word line WL).

By making the value of $C_{CM}$ larger than that of $C_{MS}$, the influence of the change in the potentials of the second wiring 202 (the bit line BL) and the third wiring 203 (the word line WL) in the read operation is suppressed and data stored in the first region 221 can be accurately read.

Further, the value of $C_{CM}$ is preferably 1.5 times or more, further preferably 5 times or more or 10 times or more that of $C_{MS}$. In this embodiment, the value of $C_{CM}$ is sufficiently larger than that of $C_{MS}$ and the influence of the change in the potentials of the second wiring 202 (the bit line BL) and the third wiring 203 (the word line WL) on the first region 221 is negligible.

Next, a write (rewrite) operation of data into the memory cell 200 will be described. Here, an operation for holding the potential VMG2 in the first region 221 included in the storage gate 212 is described.

First, as a first operation 801, the potential VCL1 is supplied to the first wiring 201 (the control line CL) connected to a memory cell 200 that is selected to be subjected to data writing, and the potential of the first control gate 211 is set at the potential VCL1. Moreover, the potential VWL1 is supplied to the third wiring 203 (the word line WL) connected to the memory cell 200 that is selected to be subjected to data writing, and the potential of the second control gate 213 is set at the potential VWL1. In addition, the potential VBL2 is supplied to the second wiring 202 (the bit line BL).

At this time, the difference between the potentials of the storage gate 212 and the second wiring 202 (the bit line BL) is larger than $Vth_{OS}$ regardless of whether the potential of the second wiring 202 (the bit line BL) is the potential VBL1 or the potential VBL2; consequently, the storage gate 212 becomes a conductor. Then, the potential VBL2 of the second wiring 202 (the bit line BL) is supplied to the entire storage gate 212, and the potential of the entire storage gate 212 becomes the potential VMG2.

Next, as a second operation 802, the potential of the third wiring 203 (the word line WL) is set at the potential VWL2 while the potentials of the first wiring 201 (the control line CL) and the second wiring 202 (the bit line BL) are maintained. As a result, the difference between the potentials of the second control gate 213 and the second wiring 202 (the bit line BL) becomes smaller than or equal to $Vth_{OS}$; thus, the second region 222, which overlaps with the second control gate 213, becomes an insulator. The first region 221 is electrically separated from the second wiring 202 (the bit line BL) and brought into a floating state, so that the potential VMG2 is held therein.

Next, as a third operation 803, the potential VCL2 is supplied to the first wiring 201 (the control line CL), and the potential of the first control gate 211 is set at the potential VCL2. Thus, the potential of the first region 221 becomes the potential VMG4.

Data is stored in the memory cell 200 in the above manner. The potential held in the storage gate 212 during the period for the write operation is a potential for turning off the transistor 210. Both of the potential differences between the storage gate 212 and the second wiring 202 (the bit line BL) and between the storage gate 212 and the third wiring 203 (the word line WL) are not smaller than $Vth_{TR}$ of the transistor 210; therefore, the transistor 210 remains off. Note that the same can be said for a period for holding stored data.

Further, when the potential of the first control gate 211 is the potential VCL2, the difference with the potential of the second wiring 202 (the bit line BL) is smaller than or equal to $Vth_{OS}$; therefore, the potential of the first region 221 is kept at the potential VMG4 even if the potential of the second wiring 202 (the bit line BL) is varied.

Data writing into the memory cell 200 is performed when the potential of the first wiring 201 (the control line CL) is the potential VCL1 and the potential of the third wiring 203 (the word line WL) is the potential VWL1. For that reason, in the case where a plurality of memory cells 200 are connected, data can be written only into a given memory cell 200.

Next, an operation of reading data stored in the memory cell 200 will be described. FIG. 3B is a timing chart of the operation in the read mode. Here, a description is given of an operation at the time when the potential VMG4 is held in the first region 221 included in the storage gate 212.

First, as a first operation 811, the potential of the first wiring 201 (the control line CL) is set at the potential VCL2; the potential of the third wiring 203 (the word line WL) is set at the potential VWL2; and the second wiring 202 (the bit line BL) is supplied with charge (precharged) to have the potential VBL1. Note that the potential VBL1 is the potential applied to the second wiring 202 (the bit line BL) by precharging here; the potential is not necessarily the potential VBL1 as long as it is different from the potential VWL2.

Next, as a second operation 812, the potential of the first wiring 201 (the control line CL) is set at the potential VCL3. When the potential of the first wiring 201 (the control line CL) becomes the potential VCL3, the potential held in the first region 221 is changed from the potential VMG4 to the potential VMG6. Since the potential VMG6 is lower than $Vth_{TR}$ of the transistor 210, the transistor 210 is turned on. When the transistor 210 is turned on, the potential of the third wiring 203 (the word line WL) is supplied to the second wiring 202 (the bit line BL) through the transistor 210, so that the potential of the second wiring 202 (the bit line BL) is changed.

In the case where the potential VMG3 is held in the first region 221, the potential held in the first region 221 becomes the potential VMG5 when the potential of the first wiring 201 (the control line CL) is set at the potential VCL3. Since the potential VMG5 is higher than $Vth_{TR}$ of the transistor 210, the transistor 210 remains off and the potential of the second wiring 202 (the bit line BL) is not changed.

In such a manner, data stored in the first region 221 included in the storage gate 212 can be read by detecting the potential of the second wiring 202 (the bit line BL) at the time when the potential of the first wiring 201 (the control line CL) is changed to the potential VCL3.

Data held in the storage gate 212 is unaffected in the operation in the read mode and after the read mode and retained until the data is rewritten with new data in a write mode. The insulated oxide semiconductor has high resistivity and charge hardly moves therein; thus, the potential of the storage gate 212 can be retained for an extremely long time.

Note that in a flash memory, it is necessary to keep a proper distance between cells in order to prevent the potential of a control gate from adversely affecting a floating gate of an adjacent cell. This is one of factors inhibiting higher integration of the semiconductor device. The factor is attributed to the following basic principle of a flash memory: tunneling current is generated by application of a high electric field.

Further, because of the above principle of a flash memory, deterioration of an insulating layer proceeds, which causes a limitation on the write cycles (approximately 10000 cycles).

The semiconductor device disclosed in this specification does not use the above principle of charge injection by tunneling current. That is, unlike a flash memory, a high electric field for charge injection is not necessary. Consequently, it is not necessary to consider the influence of a high electric field from a control gate on an adjacent cell, which facilitates high integration.

Further, since charge injection by tunneling current is not used, there is no cause for deterioration of a memory cell. In other words, the semiconductor device disclosed in this specification has higher durability and reliability than a flash memory.

In addition, the semiconductor device disclosed in this specification has advantages over a flash memory in that a high electric field is not necessary and a large peripheral circuit (such as a booster circuit) is not necessary.

In the above description, a p-channel transistor, in which holes are majority carriers, is used as the transistor 210; alternatively, an n-channel transistor, in which electrons are majority carriers, can be used instead of the p-channel transistor. In the case of using an n-channel transistor as the transistor 210, potentials supplied to the wirings are set on the basis of the above-described operation principle and can be set by replacing Formulae 9 to 15 with Formulae 16 to 22. Note that the potential VBL1 and the potential VBL2 are potentials for turning off the transistor 210, and the potential VBL1 is higher than the potential VBL2.

$$VWL1 > VMG3 - Vth_{TR} \quad \text{[Formula 16]}$$

$$VWL1 > VMG4 - Vth_{TR} \quad \text{[Formula 17]}$$

$$VWL2 > VMG3 - Vth_{TR} \quad \text{[Formula 18]}$$

$$VWL2 > VMG4 - Vth_{TR} \quad \text{[Formula 19]}$$

$$VMG5 \geq Vth_{TR} \quad \text{[Formula 20]}$$

$$VMG6 < Vth_{TR} \quad \text{[Formula 21]}$$

$$VCL3 = Vth_{TR} + VCL1 + \frac{VBL1 - VBL2}{2} \quad \text{[Formula 22]}$$

For example, in the case where an n-channel transistor with $Vth_{TR}$ of 2 V is used as the transistor 210, the potentials can be set as follows: the potential VCL1 is 3 V; the potential VCL2 is −3 V, the potential VCL3 is 6 V, the potential VBL1 is 0 V, the potential VBL2 is −2 V, the potential VWL1 is 2 V, and the potential VWL2 is −3 V.

Figure 1B:
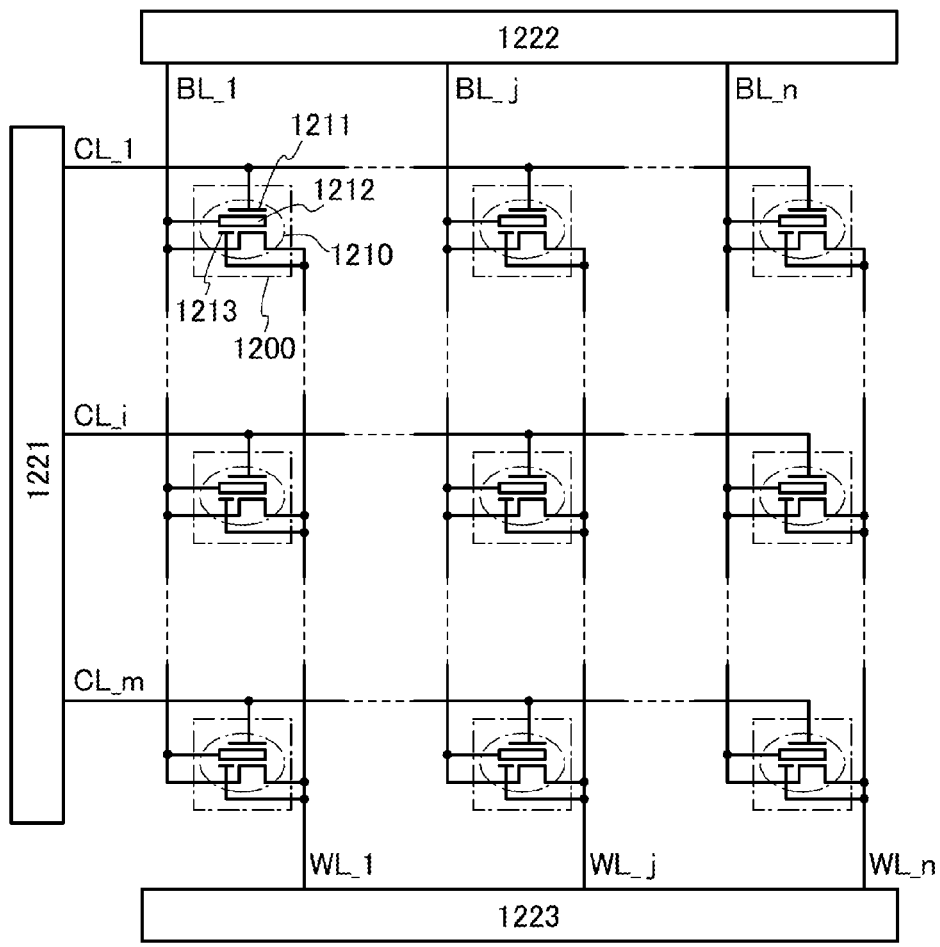

FIG. 1B illustrates an example of a circuit diagram of a semiconductor device with a memory capacity of m×n bits, including the memory cells illustrated in FIG. 1A. FIG. 1B is a circuit diagram of a NOR semiconductor device in which memory cells 1200 are connected in parallel.

The semiconductor device illustrated in FIG. 1B includes m control lines CL, n word lines WL, n bit lines BL, a memory cell array and peripheral circuits such as a first driver circuit 1221, a second driver circuit 1222, and a third driver circuit 1223. The memory cell array includes a plurality of memory cells 1200 that are arranged in a matrix of m rows (in the vertical direction) and n columns (in the horizontal direction) (m and n are natural numbers). Here, the configuration illustrated in FIG. 1A is applied to the memory cell 1200.

Each of the memory cells 1200 includes a transistor 1210. The transistor 1210 has a control gate 1211, a storage gate 1212, and a control gate 1213. The control gate 1211 is electrically connected to the control line CL. The storage gate 1212 is electrically connected to the bit line BL. The control gate 1213 is electrically connected to the word line WL. One of a source and a drain of the transistor 1210 is electrically connected to the bit line BL. The other of the source and the drain of the transistor 1210 is electrically connected to the word line WL.

A memory cell 1200 (ij) of an i-th row and a j-th column (i is an integer of 1 to m and j is an integer of 1 to n) is electrically connected to a control line CL_i, a bit line BL_j, and a word line WL_j.

The control lines CL are electrically connected to the first driver circuit 1221. The bit lines BL are electrically connected to the second driver circuit 1222. The word lines WL are electrically connected to the third driver circuit 1223. Note that the first driver circuit 1221, the second driver circuit 1222, and the third driver circuit 1223 are separately provided here; alternatively, a decoder having one or a plurality of their functions may be used.

Data can be written into the memory cell 1200 with the above-described write operation. In addition, data can be read from the memory cell 1200 with the above-described read operation. Data writing or data reading can be performed on given memory cells 1200 one by one. Moreover, one of the data write operation and the data read operation can be performed on all the memory cells 1200 connected to the control line CL at the same time.

The semiconductor device disclosed in this embodiment does not include a capacitor that is needed for DRAM in terms of the operation principle; therefore, the area per unit memory cell can be reduced, and the degree of integration and the storage capacity of the semiconductor device can be increased. For example, given that the minimum feature size is F, the area of a memory cell can be $15F^2$ to $25F^2$.

In addition, in the semiconductor device disclosed in this embodiment, stored charge hardly moves because data is stored by making the oxide semiconductor an insulator. Thus, a refresh operation needed for conventional DRAM can be unnecessary or performed much less often (e.g., per about several seconds to several hours), so that power consumption of the semiconductor device can be sufficiently reduced. Further, stored data is not destroyed by a data read operation.

In the semiconductor device disclosed in this embodiment, data can be directly rewritten by rewriting of new data to a memory cell. For that reason, an erase operation which is necessary for a flash memory or the like is not needed, so that a reduction in operation speed due to the erase operation can be prevented. That is, high-speed operation of the semiconductor device can be achieved. Moreover, a high voltage necessary for a conventional floating gate transistor to write and erase data is unnecessary, which means power consumption of the semiconductor device can be further reduced.

Figure 4:
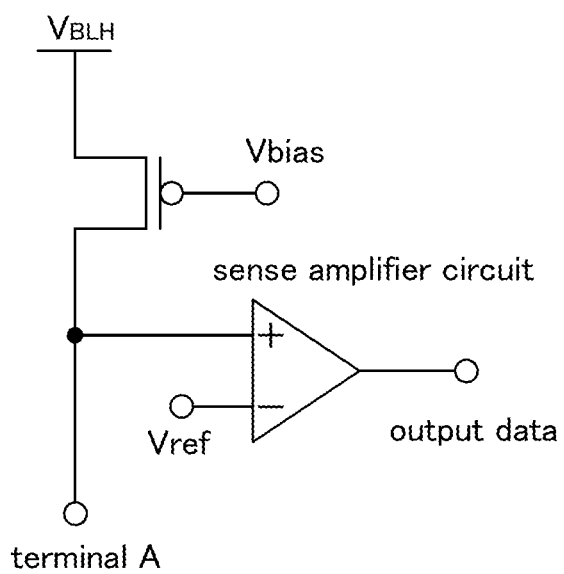
FIG. 4 is a circuit diagram of a semiconductor device.

FIG. 4 schematically illustrates a reading circuit for reading data stored in a memory cell. The reading circuit includes a transistor and a sense amplifier circuit.

At the time of reading data, a terminal A is connected to a bit line BL to which a memory cell subjected to data reading is connected. Moreover, a bias potential Vbias is applied to a gate electrode of the transistor so that the potential of the terminal A is controlled.

The sense amplifier circuit outputs high-level data when the potential of the terminal A is higher than a reference potential Vref (e.g., 1 V) and outputs low-level data when the potential of the terminal A is lower than the reference potential Vref. Specifically, first, the memory cell subjected to data reading is brought into a read mode, and the bit line BL connected to the terminal A is precharged to the potential VBL1. Next, the transistor in the reading circuit is turned on; the potential VCL3 is supplied to the control line CL; and the potential of the bit line BL connected to the terminal A is compared with the reference potential Vref. Accordingly, high-level data or low-level data is output as output data in accordance with the data stored in the memory cell.

In the above manner, data stored in the memory cell can be read using the reading circuit. Note that the reading circuit of this embodiment is an example; another known circuit may be used.

This embodiment can be implemented in combination with other embodiments as appropriate.

Embodiment 2

In this embodiment, examples of a structure and a manufacturing method of the semiconductor device described in Embodiment 1 will be described with reference to FIGS. 5A to 5C, FIGS. 6A to 6C, FIGS. 7A to 7C, FIGS. 8A to 8C, and FIGS. 9A to 9C.

<Cross-Sectional Structure and Planar Structure of Semiconductor Device>

Figure 5A:
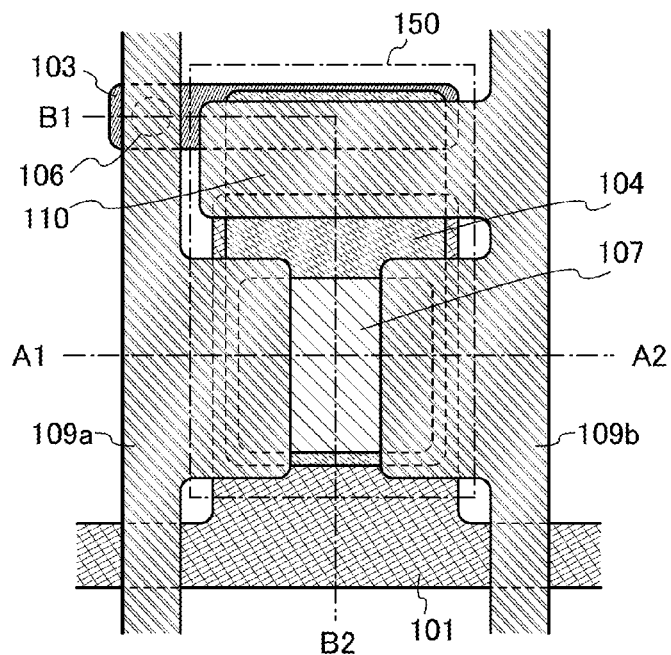
FIG. 5A is a plan view and FIGS. 5B and 5C are cross-sectional views of a semiconductor device.
Figure 5B:
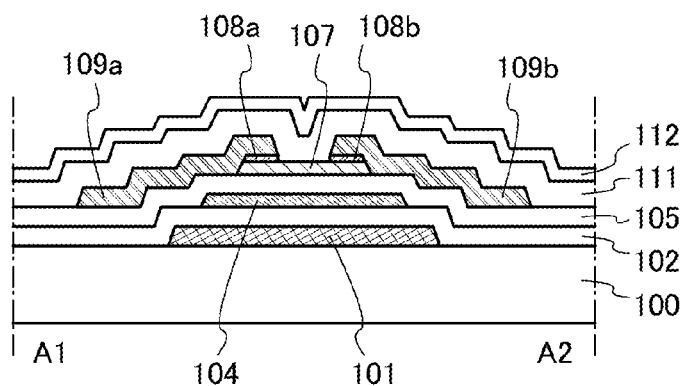
Figure 5C:
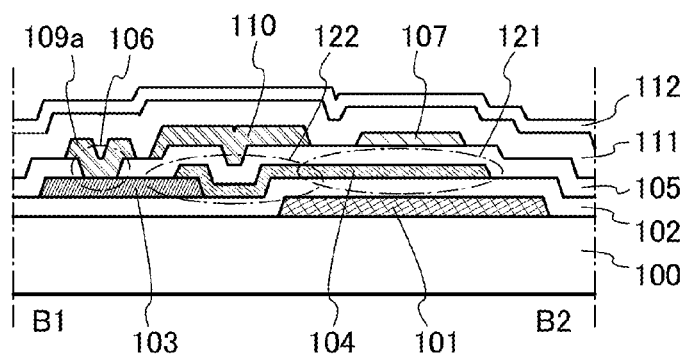

FIGS. 5A to 5C illustrate an example of a transistor that can be used as a storage element. FIG. 5A illustrates a planar structure of a transistor 150. FIG. 5B illustrates a cross section along A1-A2 in FIG. 5A. FIG. 5C illustrates a cross section along B1-B2 in FIG. 5A.

In the transistor 150, a first control gate 101 is provided over a substrate 100. A first gate insulating layer 102 is provided over the first control gate 101. An electrode 103 is provided over the first gate insulating layer 102. A storage gate 104 is provided in contact with the first gate insulating layer 102 and the electrode 103. A second gate insulating layer 105 is provided over the storage gate 104. A second control gate 110 and a semiconductor layer 107 are provided over the second gate insulating layer 105. A source region 108a and a drain region 108b are provided over the semiconductor layer 107. A source electrode 109a and a drain electrode 109b are provided over the source region 108a and the drain region 108b. An insulating layer 111 is provided over the semiconductor layer 107, the source electrode 109a, and the drain electrode 109b. A protective insulating layer 112 is provided over the insulating layer 111. The transistor 150 has a bottom-gate structure and an inverted staggered structure. A contact hole 106 is formed in the second gate insulating layer 105.

Although not shown, the first control gate 101 is electrically connected to the control line CL; the source electrode 109a and the electrode 103 are electrically connected to the bit line BL; and the drain electrode 109b and the second control gate 110 are electrically connected to the word line WL. Further, the first control gate 101 corresponds to the first control gate 211 in Embodiment 1, and the second control gate 110 corresponds to the second control gate 213 in Embodiment 1.

The electrode 103 is provided in contact with part of the storage gate 104 and supplies data to be stored to the storage gate 104. The storage gate 104 is placed between the first gate insulating layer 102 and the second gate insulating layer 105. Moreover, the storage gate 104 is placed between the first control gate 101 and the semiconductor layer 107. Further, the storage gate 104 is in contact with the first gate insulating layer 102 and the second gate insulating layer 105 at least in a region overlapping with a channel formation region of the semiconductor layer 107 (i.e., a region in the semiconductor layer 107, placed between the source region 108a and the drain region 108b).

The first control gate 101 is positioned to overlap with the storage gate 104 and the channel formation region of the semiconductor layer 107. The electrode 103 is placed apart from the first control gate 101 and the channel formation region of the semiconductor layer 107.

The storage gate 104 includes a first region 121 that overlaps with the first control gate 101 and the channel formation region of the semiconductor layer 107, and a second region 122 that extends beyond the edge of the first control gate 101 and overlaps with the second control gate 110. Data supplied from the bit line BL is stored in the first region 121 through the second region 122.

Part of the first control gate 101 and part of the second control gate 110 overlap with each other with part of the storage gate 104 sandwiched therebetween. Further, another part of the second control gate 110 and part of the electrode 103 overlap with each other with another part of the storage gate 104 sandwiched therebetween.

By controlling a state of the second region 122 (whether the second region 122 serves as a conductor or an insulator) by the second control gate 110, data stored in the storage gate 104 can be surely retained.

Figure 6A:
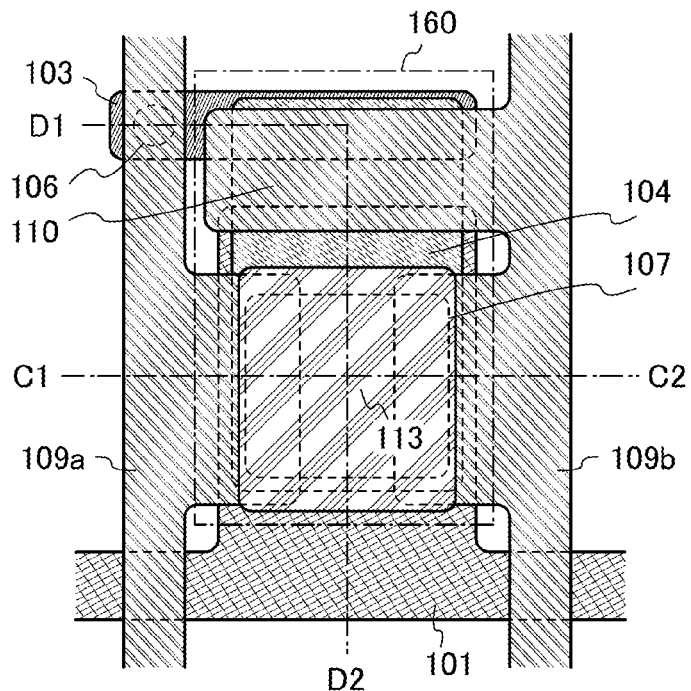
FIG. 6A is a plan view and FIGS. 6B and 6C are cross-sectional views of a semiconductor device.
Figure 6B:
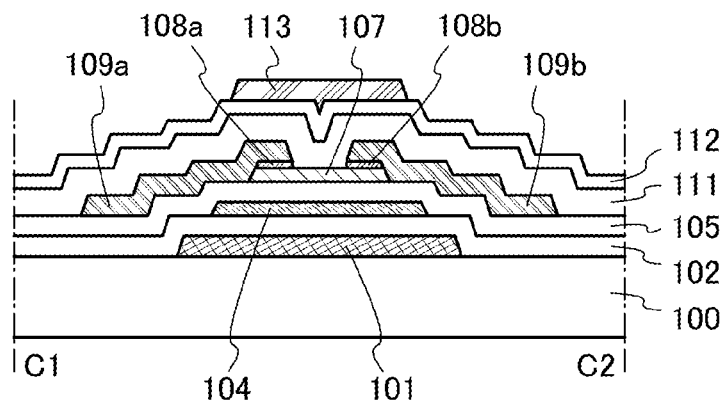
Figure 6C:
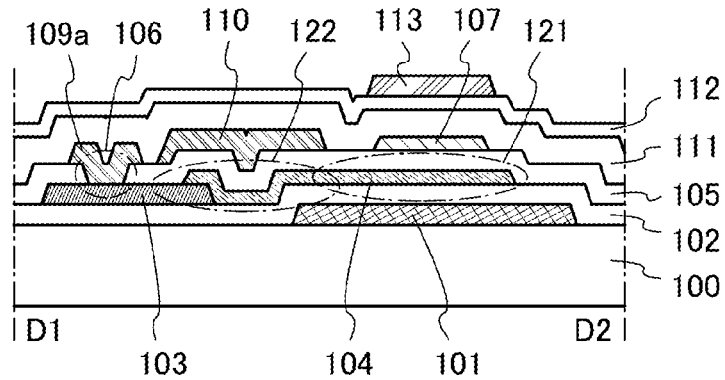

FIGS. 6A to 6C illustrate a transistor 160 as a structural example of the case where a back gate 113 is formed in the transistor 150. FIG. 6A illustrates a planar structure of the transistor 160. FIG. 6B illustrates a cross section along C1-C2 in FIG. 6A. FIG. 6C illustrates a cross section along D1-D2 in FIG. 6A.

The back gate 113 is positioned so that the channel formation region of the semiconductor layer 107 is placed between the first control gate 101 and the back gate 113. The back gate 113 can be formed using a material and a method similar to those of the first control gate 101, the source electrode 109a, the drain electrode 109b, and the like.

In FIGS. 6A to 6C, the back gate 113 is formed over the channel formation region of the semiconductor layer 107 with the insulating layer 111 and the protective insulating layer 112 placed therebetween. FIGS. 6A to 6C illustrate the example in which the back gate 113 is formed over the protective insulating layer 112; alternatively, the back gate 113 may be formed between the insulating layer 111 and the protective insulating layer 112.

The back gate 113 may be electrically connected to one of the source electrode 109a and the drain electrode 109b or electrically connected to the first control gate 101. Alternatively, the back gate 113 may be connected nowhere and electrically floating (in a floating state). The placement of the back gate 113 can reduce variations in characteristics which are caused when a plurality of transistors are formed in the semiconductor device, and realize high stability in operation of the semiconductor device. In addition, by changing the potential of the back gate, the threshold voltage of the transistor can be changed.

Figure 7A:
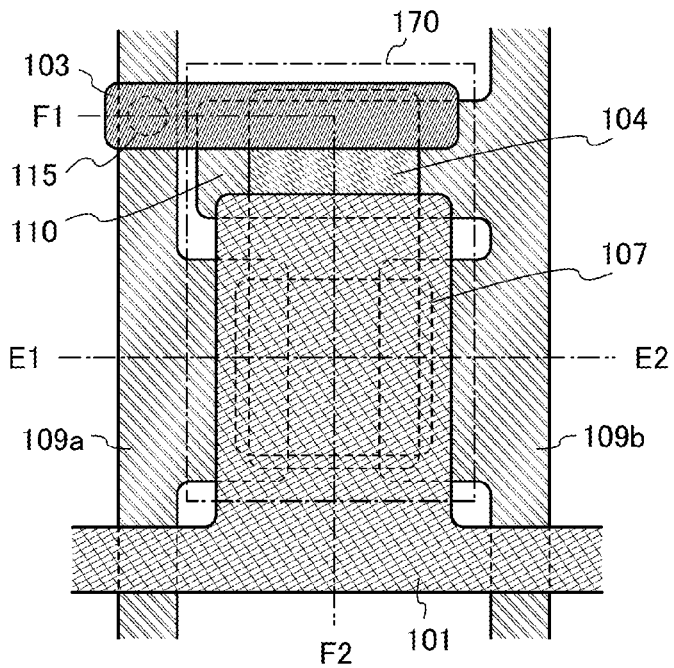
FIG. 7A is a plan view and FIGS. 7B and 7C are cross-sectional views of a semiconductor device.
Figure 7B:
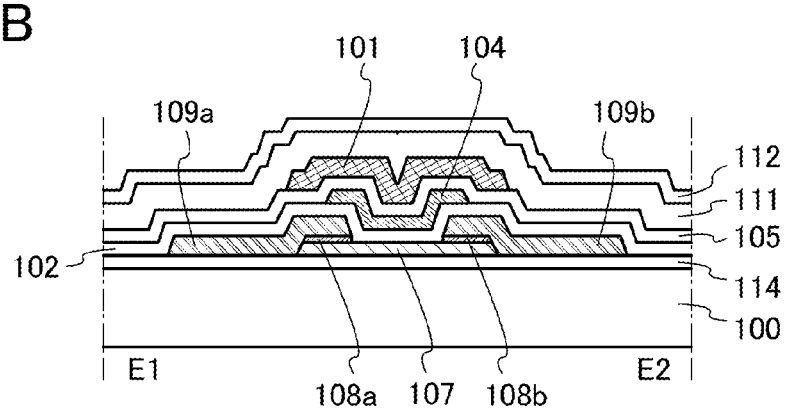
Figure 7C:
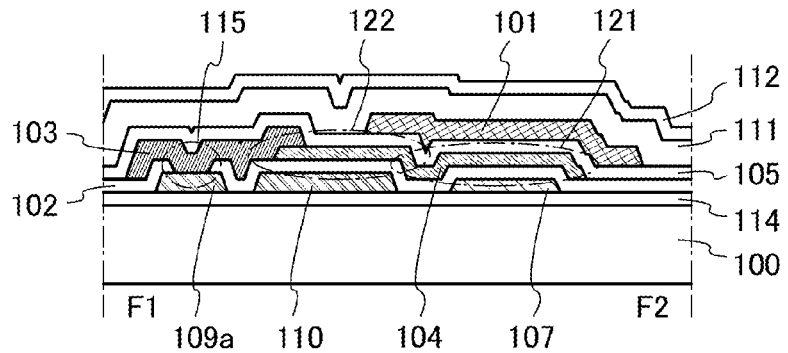

Note that the bottom-gate transistors are described as examples with reference to FIGS. 5A to 5C and FIGS. 6A to 6C; however, the structure of the transistor in this embodiment is not limited to these. A transistor 170 illustrated in FIGS. 7A to 7C is an example of a top-gate transistor. FIG. 7A illustrates a planar structure of the transistor 170. FIG. 7B illustrates a cross section along E1-E2 in FIG. 7A. FIG. 7C illustrates a cross section along F1-F2 in FIG. 7A.

In the transistor 170, a base layer 114 is provided over a substrate 100, a semiconductor layer 107 is provided over the base layer 114, and a source region 108a and a drain region 108b are provided over the semiconductor layer 107. A source electrode 109a and a drain electrode 109b are provided over the source region 108a and the drain region 108b. A second control gate 110 is provided over the base layer 114.

A first gate insulating layer 102 is provided over the semiconductor layer 107, the source electrode 109a, the drain electrode 109b, and the second control gate 110. A storage gate 104 and an electrode 103 are provided over the first gate insulating layer 102. The electrode 103 is electrically connected to the source electrode 109a through a contact hole 115 formed in the first gate insulating layer 102. The storage gate 104 is electrically connected to the source electrode 109a through the electrode 103.

A second gate insulating layer 105 is formed over the storage gate 104. A first control gate 101 is formed over the second gate insulating layer 105 so as to overlap with the semiconductor layer 107. An insulating layer 111 is provided over the first control gate 101. A protective insulating layer 112 is provided over the insulating layer 111.

The storage gate 104 includes a first region 121 that overlaps with the first control gate 101 and the channel formation region of the semiconductor layer 107, and a second region 122 that extends beyond the edge of the first control gate 101 and overlaps with the second control gate 110. Data supplied from the bit line BL is stored in the first region 121 through the second region 122.

Part of the first control gate 101 and part of the second control gate 110 overlap with each other with part of the storage gate 104 sandwiched therebetween. Further, another part of the second control gate 110 and part of the electrode 103 overlap with each other with another part of the storage gate 104 sandwiched therebetween.

Although the first control gate 101 and the semiconductor layer 107 in the transistor 170 are stacked in a different manner from those in the transistor 150, the transistor 170 can function in the same manner as the transistor 150.

In the case where the back gate 113 is provided in the transistor 170, the back gate 113 can be provided, for example, between the substrate 100 and the base layer 114 so as to overlap with the semiconductor layer 107.

Since the semiconductor layer 107 is provided as the bottom layer in the top-gate transistor, when a single crystal substrate such as a silicon wafer is used as the substrate 100, part of the single crystal substrate can be easily used as the semiconductor layer 107.

<Method for Manufacturing Semiconductor Device>

Next, as a method for manufacturing the semiconductor device shown in this embodiment, a method for manufacturing the transistor 150 will be described as an example with reference to FIGS. 8A to 8C and FIGS. 9A to 9C.

First, a conductive layer is formed over the substrate 100. Then, through a first photolithography process, the conductive layer (as well as a wiring formed from the conductive layer) is selectively removed by etching, and the first control gate 101 is formed. Note that a resist mask may be formed by an inkjet method. Formation of a resist mask by an inkjet method needs no photomask; thus, manufacturing costs can be reduced. Unless otherwise specified, a photolithography process in this specification includes a step of forming a resist mask, a step of etching a conductive layer or an insulating layer, and a step of separating the resist mask.

There is no particular limitation on a substrate that can be used as the substrate 100, and a glass substrate, a ceramic substrate, or a plastic substrate or the like with heat resistance that can withstand a process temperature in this manufacturing process can be used. In the case where the substrate does not need light-transmitting properties, a metal substrate, such as a stainless steel alloy, having an insulating layer on its surface may be used. As the glass substrate, an alkali-free glass substrate of barium borosilicate glass, aluminoborosilicate glass, aluminosilicate glass, or the like may be used, for example. Alternatively, a quartz substrate, a sapphire substrate, or the like can be used. Further alternatively, a single crystal semiconductor substrate or a polycrystalline semiconductor substrate of silicon, silicon carbide, or the like, a compound semiconductor substrate of silicon germanium or the like, an SOI substrate, or the like can be used.

Alternatively, a flexible substrate may be used as the substrate 100. In the case of using a flexible substrate, a transistor may be directly formed over a flexible substrate; alternatively, a transistor may be formed over another substrate and then separated from the substrate and transferred to a flexible substrate. Note that in order to separate the transistor from the substrate and transfer it to the flexible substrate, a separation layer is preferably provided between the substrate and the transistor.

A base layer may be provided between the substrate 100 and the first control gate 101. The base layer can be formed with a single-layer structure or a stacked structure using a material selected from aluminum nitride, aluminum oxide, aluminum nitride oxide, aluminum oxynitride, silicon nitride, silicon oxide, silicon nitride oxide, and silicon oxynitride. The base layer has a function of preventing diffusion of an impurity element from the substrate 100. In this specification, oxynitride refers to a material containing a larger quantity of oxygen than that of nitrogen, and nitride oxide refers to a material containing a larger quantity of nitrogen than that of oxygen. Note that the quantity of each element can be measured by Rutherford backscattering spectrometry (RBS) or the like, for example. The base layer can be formed by sputtering, CVD, coating, printing, or the like as appropriate.

When a halogen element such as chlorine or fluorine is contained in the base layer, a function of preventing diffusion of an impurity element from the substrate 100 can be further improved. The peak of the concentration of a halogen element contained in the base layer, measured by secondary ion mass spectrometry (SIMS), is preferably higher than or equal to $1 \times 10^{15}/cm^3$ and lower than or equal to $1 \times 10^{20}/cm^3$.

The base layer may be formed using gallium oxide. Alternatively, the base layer may have a stacked structure of a gallium oxide layer and any of the above insulating layers. Gallium oxide is a material that is hardly charged, and thus can suppress variation in threshold voltage due to charge build-up of the insulating layer.

Next, a conductive layer is formed by sputtering, vacuum evaporation, or plating, and a mask is formed over the conductive layer. Then, the conductive layer is selectively etched to form the first control gate 101. The mask formed over the conductive film can be formed by a printing method, an inkjet method, a photolithography method, or the like as appropriate.

The etching of the conductive layer may be performed by either one or both of a dry etching method and a wet etching method. As an etching gas for dry etching, a chlorine-based gas such as chlorine ($Cl_2$), boron trichloride ($BCl_3$), silicon tetrachloride ($SiCl_4$), or carbon tetrachloride ($CCl_4$)); a fluorine-based gas such as carbon tetrafluoride ($CF_4$), sulfur hexafluoride ($SF_6$), nitrogen trifluoride ($NF_3$), or trifluoromethane ($CHF_3$)); hydrogen bromide (HBr), or oxygen can be used. Further, an inert gas may be added to an etching gas. For dry etching, parallel plate reactive ion etching (RIE) or inductively coupled plasma (ICP) etching can be used.

For the first control gate 101, it is possible to use a metal element selected from aluminum (Al), chromium (Cr), copper (Cu), tantalum (Ta), titanium (Ti), molybdenum (Mo), tungsten (W), neodymium (Nd), and scandium (Sc), an alloy containing any of these metal elements as a component, an alloy containing these metal elements in combination, a nitride of any of these metal elements, or the like. Further, one or more metal elements selected from manganese (Mn), magnesium (Mg), zirconium (Zr), and beryllium (Be) may be used.

In addition, the first control gate 101 may have a single-layer structure or a stacked structure including two or more layers. Examples are a single-layer structure using aluminum containing silicon, a two-layer structure in which titanium is stacked over aluminum, a two-layer structure in which titanium is stacked over titanium nitride, a two-layer structure in which tungsten is stacked over titanium nitride, a two-layer structure in which tungsten is stacked over tantalum nitride, a two-layer structure in which Cu is stacked over Cu—Mg—Al alloy, and a three-layer structure in which titanium, aluminum, and titanium are stacked in this order.

The first control gate 101 can be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. Alternatively, the first control gate 101 can have a stacked-layer structure using the above light-transmitting conductive material and the above metal element.

Indium gallium zinc oxide containing nitrogen, indium tin oxide containing nitrogen, indium gallium oxide containing nitrogen, indium zinc oxide containing nitrogen, tin oxide containing nitrogen, indium oxide containing nitrogen, or metal nitride (e.g., InN or ZnN) may be formed to overlap with the first control gate 101 and the storage gate 104 and to be in contact with the first control gate 101 and the first gate insulating layer 102.

In this embodiment, the first control gate 101 has a two-layer structure in which tungsten is stacked over titanium nitride. Note that edges of the first control gate 101 are preferably tapered in order to improve the coverage thereof with a layer formed later.

Next, the first gate insulating layer 102 is formed over the first control gate 101. The first gate insulating layer 102 can be formed with a single-layer structure or a stacked structure using one or more of materials selected from aluminum nitride, aluminum oxide, aluminum nitride oxide, aluminum oxynitride, silicon nitride, silicon oxide, silicon nitride oxide, gallium oxide, lanthanum oxide, cesium oxide, magnesium oxide, and silicon oxynitride.

When a high-k material such as hafnium silicate (HfSi$_x$O$_y$, (x>0, y>0)), hafnium silicate to which nitrogen is added (HfSi$_x$O$_y$N$_z$ (x>0, y>0, z>0)), hafnium aluminate to which nitrogen is added (HfAl$_x$O$_y$N$_z$ (x>0, y>0, z>0)), hafnium oxide, or yttrium oxide is used for the first gate insulating layer 102, gate leakage current can be reduced by increasing the physical thickness of the gate insulating film without changing the substantial thickness (e.g., the equivalent oxide thickness) of the gate insulating film. Further, it is possible to employ a stacked structure in which a high-k material and at least one of silicon oxide, silicon oxynitride, silicon nitride, silicon nitride oxide, aluminum oxide, aluminum oxynitride, aluminum nitride, gallium oxide, lanthanum oxide, cesium oxide, and magnesium oxide. The thickness of the first gate insulating layer 102 is preferably 1 nm to 300 nm, further preferably 5 nm to 50 nm.

The first gate insulating layer 102 is formed by sputtering, CVD, or the like. Other than sputtering and plasma CVD, the first gate insulating layer 102 can be formed by, for example, high-density plasma CVD using microwaves (e.g., a frequency of 2.45 GHz). The first gate insulating layer 102 is not limited to a single layer and may be a stack of different layers.

The first gate insulating layer 102 is preferably formed using a material from which oxygen is released by heating. "Oxygen is released by heating" means that the amount of released oxygen which is converted into oxygen atoms is greater than or equal to $1.0\times10^{18}$ atoms/cm$^3$, preferably greater than or equal to $3.0\times10^{20}$ atoms/cm$^3$ in thermal desorption spectroscopy (TDS).

Figure 8A:
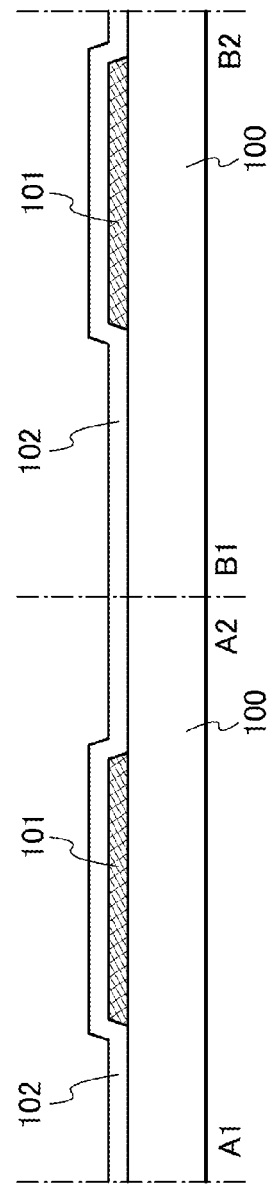
FIGS. 8A to 8C are cross-sectional views illustrating steps for manufacturing a semiconductor device.

In this embodiment, as the first gate insulating layer 102, a 100-nm-thick oxide silicon layer is formed over the first control gate 101 (see FIG. 8A).

Next, a conductive layer is formed over the first gate insulating layer 102. Then, through a second photolithography process, the conductive layer is selectively removed by etching, and the electrode 103 (as well as a wiring formed from the same layer as the electrode 103) is formed. Note that a resist mask may be formed by an inkjet method. Formation of a resist mask by an inkjet method needs no photomask; thus, manufacturing costs can be reduced.

The conductive layer used for the electrode 103 can be formed using a material and a method similar to those of the first control gate 101. In this embodiment, titanium is used for the first control gate 101.

Next, an oxide semiconductor layer with a thickness of 2 nm to 200 nm, preferably 5 nm to 30 nm is formed over the electrode 103 and the first gate insulating layer 102.

In order that hydrogen, a hydroxyl group, and moisture may be contained in the oxide semiconductor layer as little as possible, it is preferable that the substrate 100 where the electrode 103 and the first gate insulating layer 102 are formed be subjected to preheating in a preheating chamber of a sputtering apparatus as pretreatment for forming the oxide semiconductor layer so that impurities such as hydrogen and moisture adsorbed on the substrate 100 are removed and exhausted. As an exhaustion unit provided in the preheating chamber, a cryopump is preferably employed. Note that this preheating treatment can be skipped. Further, before the insulating layer 111 is formed, this preheating may be similarly performed on the substrate 100 where components up to and including the source electrode 109a and the drain electrode 109b are formed.

For the storage gate 104, a metal oxide semiconductor containing zinc can be used. Moreover, any of the following oxide semiconductors can be used, for example: an In—Sn—Ga—Zn-based oxide semiconductor which is an oxide of four metal elements; an In—Ga—Zn-based oxide semiconductor, an In—Sn—Zn-based oxide semiconductor, an In—Al—Zn-based oxide semiconductor, a Sn—Ga—Zn-based oxide semiconductor, an Al—Ga—Zn-based oxide semiconductor, and a Sn—Al—Zn-based oxide semiconductor which are oxides of three metal elements; an In—Zn-based oxide semiconductor, a Sn—Zn-based oxide semiconductor, an Al—Zn-based oxide semiconductor, a Zn—Mg-based oxide semiconductor, a Sn—Mg-based oxide semiconductor, an In—Mg-based oxide semiconductor, and an In—Ga-based oxide semiconductor which are oxides of two metal elements; and an In-based oxide semiconductor, a Sn-based oxide semiconductor, and a Zn-based oxide semiconductor. Further, SiO$_2$ may be contained in the above oxide semiconductor. The oxide semiconductor contains at least one element selected from In, Ga, Sn, and Zn.

Here, for example, an In—Ga—Zn-based oxide semiconductor means an oxide semiconductor containing indium (In), gallium (Ga), and zinc (Zn), and there is no limitation on the composition ratio thereof. The In—Ga—Zn-based oxide semiconductor may contain an element other than In, Ga, and Zn. In this case, the oxide semiconductor preferably contains a larger amount of oxygen than the stoichiometric proportion. When the amount of oxygen is in excess of stoichiometric proportion, generation of carriers which results from oxygen vacancy in the oxide semiconductor can be suppressed.

For the oxide semiconductor layer, a thin film expressed by a chemical formula of InMO$_3$(ZnO)$_m$ (m>0) can be used. Here, M represents one or more of metal elements selected from Zn, Ga, Al, Mn, and Co. For example, M can be Ga, Ga and Al, Ga and Mn, or Ga and Co.

In the case where an In—Zn-based oxide material is used as the oxide semiconductor, the atomic ratio is set so that In/Zn ranges from 0.5 to 50, preferably from 1 to 20, further preferably from 1.5 to 15. When the atomic ratio of Zn is in the above preferred range, the field-effect mobility of a transistor can be improved. Here, when the atomic ratio of the compound is In:Zn:O=X:Y:Z, the relation Z>1.5X+Y is satisfied.

In this embodiment, the oxide semiconductor is formed to a thickness of 30 nm by sputtering using an In—Ga—Zn-based oxide target. The oxide semiconductor layer can be formed by sputtering in a rare gas (typically argon) atmosphere, an oxygen atmosphere, or a mixed atmosphere of a rare gas and oxygen (see FIG. 8B).

Here, a sputtering apparatus used for forming the oxide semiconductor will be described below in detail.

The leakage rate of a deposition chamber in which the oxide semiconductor is formed is preferably lower than or equal to $1\times10^{-10}$ Pa·m$^3$/s; thus, entry of impurities into the film can be suppressed during the deposition by sputtering.

In order to decrease the leakage rate, internal leakage as well as external leakage needs to be reduced. The external leakage refers to inflow of gas from the outside of a vacuum system through a minute hole, a sealing defect, or the like. The internal leakage is due to leakage through a partition, such as a valve, in a vacuum system or due to released gas from an internal member. Measures need to be taken from both aspects of external leakage and internal leakage in order that the leakage rate be lower than or equal to $1\times10^{-10}$ Pa·m$^3$/s.

In order to decrease external leakage, an open/close portion of the deposition chamber is preferably sealed with a metal gasket. For the metal gasket, a metal material covered with iron fluoride, aluminum oxide, or chromium oxide is preferably used. The metal gasket realizes higher adhesion than an O-ring and can reduce the external leakage. Further, by using a metal material covered with iron fluoride, aluminum oxide, chromium oxide, or the like which is in the passive state, released gas containing hydrogen generated from the metal gasket is suppressed, so that the internal leakage can also be reduced.

As a member forming an inner wall of the deposition chamber, aluminum, chromium, titanium, zirconium, nickel, or vanadium, from which the amount of a released gas containing hydrogen is smaller, is used. An alloy material containing iron, chromium, nickel, and the like covered with the above-mentioned material may be used. The alloy material containing iron, chromium, nickel, and the like is rigid, resistant to heat, and suitable for processing. Here, when surface unevenness of the member is decreased by polishing or the like to reduce the surface area, the released gas can be reduced. Alternatively, the member of the deposition apparatus may be covered with iron fluoride, aluminum oxide, chromium oxide, or the like which is in the passive state.

Further, it is preferable to provide a sputtering gas purifier so that the sputtering gas is refined just before being introduced into the deposition chamber. In this case, the length of a pipe between the gas purifier and the deposition chamber is less than or equal to 5 m, preferably less than or equal to 1 m. When the length of the pipe is less than or equal to 5 m or less than or equal to 1 m, the effect of the released gas from the pipe can be reduced accordingly.

The deposition chamber is preferably evacuated with a rough vacuum pump such as a dry pump, and a high vacuum pump such as a sputter ion pump, a turbo molecular pump, or a cryopump in appropriate combination. In order to remove moisture remaining in the deposition chamber, an entrapment vacuum pump, such as a cryopump, an ion pump, or a titanium sublimation pump, is preferably used. The turbo molecular pump has an outstanding capability in evacuating a large-sized molecule, whereas it has a low capability in evacuating hydrogen or water. Hence, a combination of a cryopump having a high capability in evacuating water and a sputter ion pump having a high capability in evacuating hydrogen is effective. Further, an evacuation unit may be a turbo molecular pump provided with a cold trap. In the deposition chamber which is evacuated with an entrapment vacuum pump such as a cryopump, a hydrogen atom, a compound containing a hydrogen atom, such as water (H$_2$O), (more preferably, also a compound containing a carbon atom), and the like are removed, whereby the concentration of impurities contained in the oxide semiconductor layer formed in the deposition chamber can be reduced.

An adsorbate inside the deposition chamber does not affect the pressure in the deposition chamber because it is adsorbed on the inner wall, but leads to release of gas at the time of the evacuation of the deposition chamber. Therefore, although there is no correlation between the leakage rate and the evacuation rate, it is important that the adsorbate present in the deposition chamber be desorbed as much as possible and evacuation be performed in advance with the use of a pump with high evacuation capability. Note that the deposition chamber may be subjected to baking for promoting desorption of the adsorbate. By the baking, the desorption rate of the adsorbate can be increased about tenfold. The baking may be performed at temperatures ranging from 100° C. to 450° C. At this time, when the adsorbate is removed while an inert gas is added, the desorption rate of water or the like, which is difficult to desorb simply by evacuation, can be further increased.

For sputtering, an RF power supply device, an AC power supply device, a DC power supply device, or the like can be used as appropriate as a power supply device for generating plasma.

As a target for forming the oxide semiconductor by sputtering, a target that contains a metal oxide containing In, Ga, and Zn at a composition ratio of In$_2$O$_3$:Ga$_2$O$_3$:ZnO=1:1:1 [molar ratio] can be used, for example. Alternatively, it is possible to use a target with a composition ratio of In$_2$O$_3$:Ga$_2$O$_3$:ZnO=1:1:2 [molar ratio], a target with a composition ratio of In$_2$O$_3$:Ga$_2$O$_3$:ZnO=1:1:4 [molar ratio], or a target with a composition ratio of In$_2$O$_3$:Ga$_2$O$_3$:ZnO=2:1:8 [molar ratio]. Note that an In—Ga—Zn-based oxide semiconductor can be referred to as IGZO.

In the case where an In—Sn—Zn-based oxide semiconductor is used as the oxide semiconductor, a target may have a composition ratio of In:Sn:Zn=1:2:2, In:Sn:Zn=2:1:3, In:Sn:Zn=1:1:1, or In:Sn:Zn=20:45:35 in an atomic ratio, for example.

The relative density of the metal oxide target is 90% to 100%, preferably 95% to 99.9%. With the use of a metal oxide target with a high filling rate, a dense oxide semiconductor layer can be deposited.

As a sputtering gas, a rare gas (typically argon) atmosphere, an oxygen gas atmosphere, or a mixed gas of a rare gas and oxygen is used as appropriate. It is preferable that a high-purity gas from which impurities such as hydrogen, water, a hydroxyl group, and hydride are removed be used as a sputtering gas. For example, when argon is used as a sputtering gas, it is preferable that the purity be 9N, the dew point be −121° C., the content of H$_2$O be 0.1 ppb or lower, and the content of H$_2$ be 0.5 ppb or lower. When oxygen is used as a sputtering gas, it is preferable that the purity be 8N, the dew point be −112° C., the content of H$_2$O be 1 ppb or lower, and the content of H$_2$ be 1 ppb or lower.

When the oxide semiconductor is deposited, the substrate is held in a deposition chamber kept under a reduced pressure and the substrate temperature is set at 100° C. to 600° C., preferably 300° C. to 500° C.

By heating the substrate during deposition, the concentration of impurities, such as hydrogen, moisture, hydride, or hydroxide, contained in the deposited oxide semiconductor layer can be reduced. In addition, damage by sputtering is reduced. Then, a sputtering gas from which hydrogen and moisture are removed is introduced into the deposition chamber while moisture remaining therein is removed, and the oxide semiconductor layer is formed with the use of the above target.

The concentration of an alkali metal such as Na or Li in the oxide semiconductor layer is preferably $1\times10^{18}$ atoms/cm$^3$ or lower, further preferably $2\times10^{16}$ atoms/cm$^3$ or lower.

An example of the film formation conditions is as follows: the distance between the substrate and the target is 100 mm, the pressure is 0.6 Pa, the electric power of the DC power source is 0.5 kW, and oxygen (the flow rate ratio of oxygen is 100%) is used as a sputtering gas. Note that a pulsed direct-current power source is preferably used, in which case powder substances (also referred to as particles or dust) generated during the deposition can be reduced and the film thickness can be uniform.

Note that the oxide semiconductor layer sometimes contains a considerable amount of nitrogen even if it is formed by using the above-described sputtering apparatus. For example, in some cases, the concentration of nitrogen in the oxide semiconductor layer, measured by secondary ion mass spectrometry (SIMS), is less than $5\times10^{18}$ atoms/cm$^3$.

It is preferable that the first gate insulating layer 102 and the oxide semiconductor layer serving as the storage gate 104 be successively formed without being exposed to the air. By forming the first gate insulating layer 102 and the oxide semiconductor layer successively without exposure to the air, impurities such as water, hydrogen, or hydrocarbon can be prevented from being attached to the interface between the first gate insulating layer 102 and the oxide semiconductor layer.

Next, first heat treatment is performed. With the first heat treatment, excessive hydrogen (including water and a hydroxyl group) in the oxide semiconductor layer is removed (dehydration or dehydrogenation) and the oxide semiconductor layer can be purified.

The first heat treatment is performed at a temperature in the range of 250° C. to 750° C. or at a temperature higher than or equal to 400° C. and lower than the strain point of the substrate in a reduced pressure atmosphere, an inert gas atmosphere such as a nitrogen atmosphere or a rare gas atmosphere, an oxygen gas atmosphere, or an ultra-dry air (with a moisture content of 20 ppm (equivalent to a dew point of −55° C.) or lower, preferably 1 ppm or lower, further preferably 10 ppb or lower when measured with a dew-point meter using cavity ring-down laser spectroscopy (CRDS)). For example, the substrate is put in an electric furnace which is one of heat treatment apparatuses, and the oxide semiconductor layer is subjected to heat treatment at 450° C. for one hour in a nitrogen atmosphere.

Note that a heat treatment apparatus is not limited to an electrical furnace, and may include a device for heating an object by heat conduction or heat radiation from a heating element such as a resistance heating element. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. A GRTA apparatus is an apparatus for heat treatment using a high-temperature gas. As the high-temperature gas, an inert gas which does not react with an object by heat treatment, such as nitrogen or a rare gas like argon, is used.

For example, as the first heat treatment, GRTA may be performed in the following manner: the substrate is moved into an inert gas heated to a temperature as high as 650° C. to 700° C., heated for several minutes, and moved out of the inert gas heated to the high temperature.

When the heat treatment is performed in an atmosphere of an inert gas such as nitrogen or a rare gas, oxygen, or ultra-dry air, it is preferable that the atmosphere do not contain water, hydrogen, and the like. The purity of nitrogen, oxygen, or the rare gas which is introduced into a heat treatment apparatus is set to 6N (99.9999%) or higher, preferably 7N (99.99999%) or higher (i.e., the impurity concentration is 1 ppm or lower, preferably 0.1 ppm or lower).

Figure 8B:
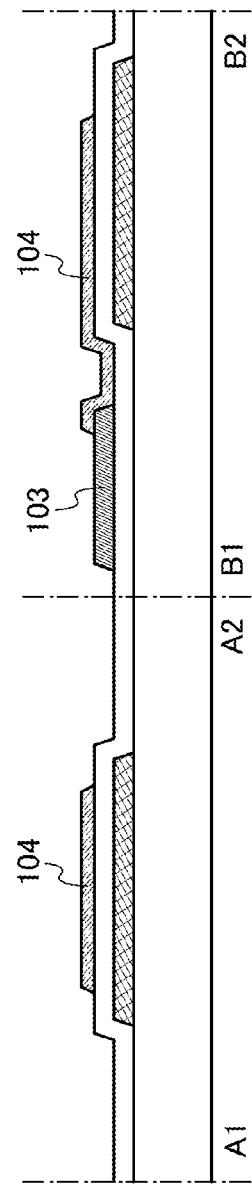

Next, through a third photolithography process, the oxide semiconductor layer is selectively removed by etching, and the storage gate 104 is formed (see FIG. 8B). Note that a resist mask for forming the storage gate 104 may be formed by an inkjet method, in which case manufacturing costs can be reduced because a photomask is not used.

Note that the etching of the oxide semiconductor layer may be dry etching, wet etching, or both dry etching and wet etching. As an etchant used for wet etching of the oxide semiconductor layer, a mixed solution of phosphoric acid, acetic acid, and nitric acid can be used, for example. Alternatively, ITO-07N (produced by Kanto Chemical Co., Inc.) may be used.

After the resist mask is removed, oxygen may be introduced into the storage gate 104. Oxygen can be introduced by plasma doping. Specifically, oxygen is turned into plasma with the use of radio-frequency (RF) power, and oxygen radicals and/or oxygen ions are introduced into the oxide semiconductor layer over the substrate. At this time, it is preferable to apply a bias to the substrate where the storage gate 104 is formed. By increasing the bias applied to the substrate, oxygen can be introduced more deeply. Oxygen may be introduced by ion implantation.

Oxygen (an oxygen radical, an oxygen atom, and/or an oxygen ion) introduced into the storage gate 104 by plasma doping may be supplied from a plasma generation apparatus with the use of a gas containing oxygen or from an ozone generation apparatus. Specifically, for example, oxygen can be generated with an apparatus for etching treatment on a semiconductor device, an apparatus for ashing on a mask, or the like to process the storage gate 104.

By introduction of oxygen into the storage gate 104, the storage gate 104 (the oxide semiconductor) containing excessive oxygen is formed. The electronegativity of oxygen, 3.0, is larger than that of metals (Zn, Ga, and In) contained in the oxide semiconductor layer, about 2.0; therefore, when the oxide semiconductor layer contains a larger quantity of oxygen than hydrogen, oxygen deprives the M—H bond of a hydrogen atom and forms an OH group. This OH group may form an M-O—H group by being bonded to M.

That is, by the introduction of oxygen, a bond between a metal included in the oxide semiconductor and hydrogen or a bond between the metal and a hydroxyl group is cut. At the same time, the hydrogen or the hydroxyl group reacts with oxygen to produce water. In particular, oxygen with an unpaired electron easily reacts with hydrogen remaining in the oxide semiconductor to produce water. Consequently, hydrogen or a hydroxyl group which is an impurity can be easily eliminated as water by the heat treatment performed later.

After the introduction of oxygen to the storage gate 104, second heat treatment is performed (preferably at 200° C. to 600° C., for example, at 250° C. to 550° C.). For example, the second heat treatment is performed at 450° C. for one hour in a nitrogen atmosphere. It is preferable that the above atmosphere do not contain water, hydrogen, or the like.

Through the above steps, dehydration or dehydrogenation of the oxide semiconductor layer can be performed with the introduction of oxygen and the heat treatment, whereby remaining impurities containing a hydrogen molecule (e.g., hydrogen, moisture, a hydroxyl group, or a hydride (also referred to as a hydrogen compound)), which cannot be removed completely in the first heat treatment, can be removed from the storage gate 104. Further, it is possible to supply oxygen, which is one of the main components of the oxide semiconductor and is reduced at the same time as a step for removing impurities, so that the oxide semiconductor used for the storage gate 104 can be made to be i-type (intrinsic). In addition, defects generated at the interface between the storage gate 104 and the insulating layer in contact with the storage gate 104 can be reduced. In such a manner, the oxide semiconductor used for the storage gate 104 can be an electrically i-type oxide semiconductor.

Figure 8C:
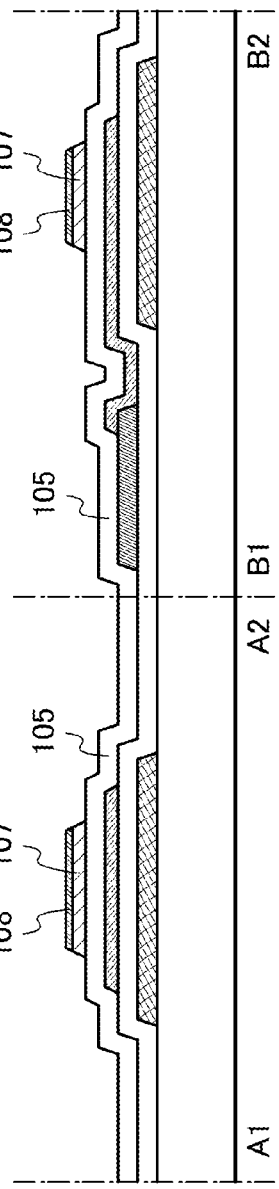

Then, the second gate insulating layer 105 is formed to cover the storage gate 104 and the electrode 103 (see FIG. 8C). The second gate insulating layer 105 can be formed using a material and a method which are similar to those of the first gate insulating layer 102.

Next, a semiconductor layer is formed over the second gate insulating layer 105. Then, through a fourth photolithography process, the semiconductor layer is selectively removed by etching, thereby forming the semiconductor layer 107 in which a channel of the transistor 150 is formed and a semiconductor layer 108 to be a source region and a drain region. For the semiconductor layers 107 and 108, a single crystal semiconductor, a polycrystalline semiconductor, a microcrystalline semiconductor, an amorphous semiconductor, or the like can be used. Examples of a semiconductor material are silicon, germanium, silicon germanium, silicon carbide, and gallium arsenide. The transistor 150 containing such a semiconductor material can operate at sufficiently high speed, so that stored data can be read at high speed, for example. In other words, high-speed operation of the semiconductor device can be achieved.

The semiconductor can be deposited by CVD or sputtering, for example. A polycrystalline semiconductor or a microcrystalline semiconductor can be obtained by forming an amorphous semiconductor and then performing heat treatment or laser light irradiation on the amorphous semiconductor.

In this embodiment, as a semiconductor layer for forming the semiconductor layer 107, microcrystalline silicon is deposited by plasma CVD. As a semiconductor source gas for forming the semiconductor layer 107, a gas containing silane ($SiH_4$) or disilane ($Si_2H_6$) can be used. The thickness of the semiconductor layer 107 preferably ranges from 10 nm to 300 nm.

In addition, as a semiconductor layer for forming the semiconductor layer 108, p-type microcrystalline silicon is deposited by plasma CVD. The semiconductor layer 108 containing a p-type impurity can be formed using a mixture gas of silane ($SiH_4$) or disilane ($Si_2H_6$) and a semiconductor source gas containing an impurity element belonging to Group 13 (e.g., boron (B)). The thickness of the semiconductor layer 108 preferably ranges from 10 nm to 100 nm.

Alternatively, the semiconductor layer 108 containing a p-type impurity may be formed in such a manner that a silicon layer that does not contain an impurity element is formed and then an impurity element is introduced into the silicon layer by ion implantation, plasma doping, or the like. After being introduced by ion implantation or the like, the impurity element is preferably diffused by heating or the like. By using a p-type semiconductor for the semiconductor layer 108, the transistor 150 can be a p-channel transistor.

In addition, a semiconductor used for the semiconductor layer 108 can be an n-type semiconductor when a semiconductor source gas containing an impurity element belonging to Group 15 (e.g., phosphorus (P)) instead of an impurity element of Group 13 is mixed into a semiconductor source gas for forming the semiconductor layer 108. Alternatively, the n-type semiconductor layer 108 may be formed in such a manner that a silicon layer that does not contain an impurity element is formed and then an impurity element is introduced into the silicon layer by ion implantation, plasma doping, or the like. After being introduced by ion implantation or the like, the impurity element is preferably diffused by heating or the like. By using an n-type semiconductor for the semiconductor layer 108, the transistor 150 can be an n-channel transistor.

Alternatively, it is possible that the semiconductor layer 108 containing an impurity is not formed and a source region, a drain region, and a channel formation region are provided in the semiconductor layer 107 by introducing an impurity into part of the semiconductor layer 107 by ion implantation, plasma doping, or the like.

The threshold voltage of the transistor 150 can be varied when an appropriate amount of impurity elements is contained in the channel formation region of the semiconductor layer 107.

Alternatively, an oxide semiconductor can be used for the semiconductor layer 107. The oxide semiconductor can be formed using a material and a method similar to those of the storage gate 104. The oxide semiconductor is preferably purified by sufficient removal of impurities such as hydrogen or sufficient supply of oxygen. Specifically, the concentration of hydrogen in the oxide semiconductor layer is $5 \times 10^{19}$ atoms/$cm^3$ or lower, preferably $5 \times 10^{18}$ atoms/$cm^3$ or lower, further preferably $5 \times 10^{17}$ atoms/$cm^3$ or lower, for example. Note that the above hydrogen concentration of the oxide semiconductor layer was measured by SIMS (secondary ion mass spectrometry).

The oxide semiconductor purified by a sufficient reduction in hydrogen concentration, in which defect levels in the energy gap due to oxygen vacancy are reduced as a result of sufficient supply of oxygen, has a carrier density of less than $1 \times 10^{12}/cm^3$, preferably less than $1 \times 10^{11}/cm^3$, further preferably less than $1.45 \times 10^{10}/cm^3$. For example, the off-state current (per unit channel width (1 µm) here) at room temperature (25° C.) is 100 zA/µm (1 zA (zeptoampere) is $1 \times 10^{-21}$ A) or lower, preferably 10 zA/µm or lower. The off-state current at 85° C. is 100 zA/µm ($1 \times 10^{-19}$ A/µm) or lower, preferably 10 zA/µm ($1 \times 10^{-20}$ A/µm) or lower. The transistor 150 with excellent off-state current characteristics can be obtained with the use of such an oxide semiconductor that is made to be an electrically i-type (intrinsic) or substantially i-type.

Note that as the oxide semiconductor used for the storage gate 104 and the semiconductor layers 107 and 108, an amorphous oxide semiconductor or an oxide semiconductor with crystallinity may be used. For example, as the oxide semiconductor, it is possible to use a c-axis-aligned crystalline oxide semiconductor (CAAC-OS) including non-single-crystal crystal portions in each of which a triangular, hexagonal, regular triangular, or regular hexagonal atomic arrangement is formed when seen from the direction perpendicular to the a-b plane, and metal atoms are arranged in a layered manner or metal atoms and oxygen atoms are arranged in a layered manner in the c-axis direction. Note that the directions of the a-axis and the b-axis of one crystal portion may be different from those of another crystal portion. In this specification, the term "perpendicular" includes a range from 85° to 95°. The term "parallel" includes a range from −5° to 5°.

The CAAC-OS is neither single crystal nor completely amorphous. Although the CAAC-OS includes a crystallized portion (a crystal portion), a boundary between one crystal portion and another crystal portion is not clear in some cases. For example, an image observed by a transmission electron microscope (TEM) does not clearly show a boundary between an amorphous portion and a crystal portion in the CAAC-OS film. Moreover, a grain boundary in the CAAC-OS is not found with the TEM. Thus, a decrease in the electron mobility due to a grain boundary is suppressed in the CAAC-OS.

Nitrogen may be substituted for part of oxygen included in the CAAC-OS. The c-axes of individual crystal portions included in the CAAC-OS may be aligned in one direction (e.g., a direction perpendicular to a surface where the CAAC-OS is formed or a direction perpendicular to a surface of the CAAC-OS). Alternatively, the normals of the a-b planes of the individual crystal portions included in the CAAC-OS may be aligned in one direction (e.g., a direction perpendicular to a surface where the CAAC-OS is formed or a direction perpendicular to a surface of the CAAC-OS).

The c-axes of the crystal portions included in the CAAC-OS are aligned in the direction parallel to a normal vector of the surface where the CAAC-OS is formed or a normal vector of the surface of the CAAC-OS; accordingly, the c-axes directions may be different from each other depending on the shape of the CAAC-OS (the cross-sectional shape of the surface where the CAAC-OS is formed or the cross-sectional shape of the surface of the CAAC-OS). Note that the directions of c-axes of the crystal portions are parallel to a normal vector of the surface where the CAAC-OS is formed or a normal vector of the surface of the CAAC-OS. The crystal portion is formed through film formation or crystallization treatment such as heat treatment after the film formation.

Note that the crystal portions in the CAAC-OS film are not necessarily distributed uniformly. For example, in the case where crystals grow from the surface side of the oxide semiconductor film in the process of forming the CAAC-OS film, the proportion of the crystal portions is sometimes higher in the vicinity of the surface of the CAAC-OS film than in the vicinity of the surface where the CAAC-OS film is formed. Further, by addition of an impurity to the CAAC-OS film, a crystal portion is sometimes made amorphous in a region to which the impurity is added.

The CAAC-OS can serve as a conductor or an insulator depending on its composition or the like. The CAAC-OS transmits or does not transmit visible light depending on its composition or the like. An example of such a CAAC-OS is a crystal that is formed into a film shape, has a triangular or hexagonal atomic arrangement when observed from the direction perpendicular to a surface of the film, a surface of a substrate, or an interface, and has a layered arrangement of metal atoms or a layered arrangement of metal atoms and oxygen atoms (or nitrogen atoms) when observed from the cross-sectional direction.

In a transistor in which the CAAC-OS is used for the semiconductor layer including the channel formation region, the amount of change in threshold voltage between before and after light irradiation or a bias-temperature (BT) stress test can be small; thus, such a transistor has stable electric characteristics.

The CAAC-OS can be formed by performing deposition while the substrate is heated at temperatures ranging from 150° C. to 450° C., preferably from 200° C. to 350° C., in which case moisture (including hydrogen) or the like can be prevented from entering the film.

Further, it is preferable to perform heat treatment on the substrate after formation of the oxide semiconductor so that hydrogen is further released from the oxide semiconductor and part of oxygen contained in the insulating layer in contact with the oxide semiconductor is diffused into the oxide semiconductor. Moreover, by performing the heat treatment, a CAAC-OS with higher crystallinity can be formed.

The temperature of the heat treatment is preferably a temperature at which hydrogen is released from the oxide semiconductor and part of oxygen contained in the insulating layer in contact with the oxide semiconductor is released and diffused into the oxide semiconductor. The temperature typically ranges from 150° C. to the strain point of the substrate, preferably from 250° C. to 450° C., further preferably from 300° C. to 450° C.

A rapid thermal annealing (RTA) apparatus can be used for the heat treatment. With the use of the RTA apparatus, the heat treatment can be performed at a temperature higher than or equal to the strain point of the substrate only in a short time. Thus, the time required to form the oxide semiconductor in which the ratio of crystal regions to amorphous regions is high can be shortened.

The heat treatment can be performed in an inert gas atmosphere, preferably in a rare gas (e.g., helium, neon, argon, xenon, or krypton) atmosphere or a nitrogen atmosphere. Alternatively, the heat treatment may be performed in an oxygen atmosphere or a reduced pressure atmosphere. The heating time is 3 minutes to 24 hours. The ratio of crystal regions to amorphous regions in the oxide semiconductor can be increased as the treatment time is prolonged. However, heat treatment for longer than 24 hours is not preferable because the productivity is reduced.

Through the above steps, the CAAC-OS can be formed.

Figure 9A:
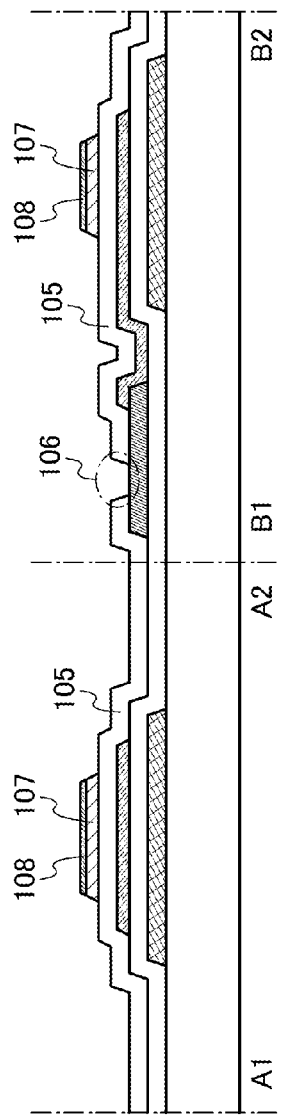
FIGS. 9A to 9C are cross-sectional views illustrating steps for manufacturing a semiconductor device.

Next, through a fifth photolithography process, the second gate insulating layer 105 is selectively removed by etching so as to expose part of the electrode 103, so that the contact hole 106 is formed to overlap with the electrode 103 (see FIG. 9A). The resist mask used for forming the contact hole 106 may be formed by an inkjet method. Formation of the resist mask by an inkjet method needs no photomask; thus, manufacturing costs can be reduced.

The etching of the second gate insulating layer 105 may be performed using dry etching, wet etching, or a combination of dry etching and wet etching. As an etching gas for dry etching, a chlorine-based gas such as chlorine ($Cl_2$), boron trichloride ($BCl_3$), silicon tetrachloride ($SiCl_4$), or carbon tetrachloride ($CCl_4$); a fluorine-based gas such as carbon tetrafluoride ($CF_4$), sulfur hexafluoride ($SF_6$), or nitrogen trifluoride ($NF_3$); or oxygen can be used as appropriate. Further, an inert gas may be added to an etching gas. An etchant for wet etching can be a hydrofluoric acid-based solution, such as a mixture solution containing ammonium hydrogen fluoride and ammonium fluoride.

Next, a conductive layer serving as the second control gate 110, the source electrode 109a, and the drain electrode 109b (as well as a wiring formed from the conductive layer) is formed. The conductive layer used for the second control gate 110, the source electrode 109a, and the drain electrode 109b can be formed using a material and a method which are similar to those of the electrode 103 or the first control gate 101. Further, the conductive layer used for the second control gate 110, the source electrode 109a, and the drain electrode 109b may be formed using a conductive metal oxide. Examples of the conductive metal oxide are indium oxide ($In_2O_3$), tin oxide ($SnO_2$), zinc oxide (ZnO), an alloy of indium oxide and tin oxide ($In_2O_3$—$SnO_2$, referred to as ITO), an alloy of indium oxide and zinc oxide ($In_2O_3$—ZnO), and any of these metal oxide materials containing silicon oxide.

Figure 9B:
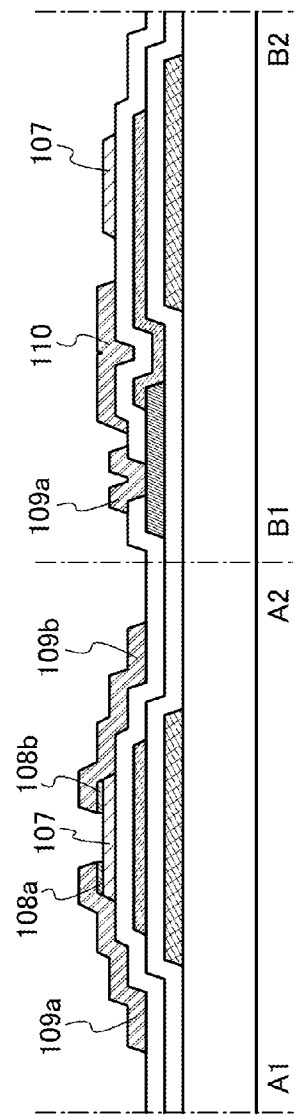
Figure 9C:
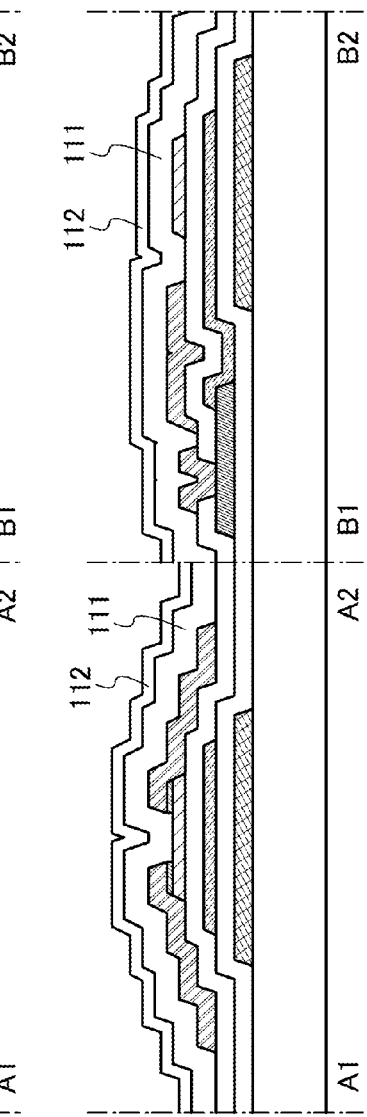

Through a sixth photolithography process, a resist mask is formed over the conductive layer, and selective etching is performed to form the second control gate 110, the source electrode 109a, and the drain electrode 109b (see FIG. 9B). Note that a resist mask may be formed by an inkjet method, in which case manufacturing costs can be reduced because a photomask is not used.

The etching of the conductive layer may be performed by either one or both of dry etching and wet etching. Then, part of the semiconductor layer 108 is etched using the source electrode 109a and the drain electrode 109b as masks, thereby forming the source region 108a and the drain region 108b. The etching conditions of the semiconductor layer 108 are adjusted as appropriate so that the semiconductor layer 107 is not removed in etching of the semiconductor layer 108. Note that in some cases, the semiconductor layer 107 is partly etched in the etching step and thus has a groove portion (a recessed portion) depending on the materials and the etching conditions. In addition, etching of the semiconductor layer 108 can be concurrently performed with etching of the conductive layer.

Next, the insulating layer 111 is formed over the semiconductor layer 107, the second control gate 110, the source electrode 109a, and the drain electrode 109b. The insulating layer 111 can be formed using a material and a method similar to those of the first gate insulating layer 102. In the case where an oxide semiconductor is used for the semiconductor layer 107, a metal oxide layer containing the same kind of component as the oxide semiconductor may be formed as the insulating layer 111 or stacked over the insulating layer 111.

In this embodiment, a 200-nm-thick silicon oxide layer is formed by sputtering as the insulating layer 111. The substrate temperature in the film formation is higher than or equal to room temperature and lower than or equal to 300° C. and is 100° C. in this embodiment. The silicon oxide layer can be formed by sputtering in a rare gas (typically argon) atmosphere, an oxygen atmosphere, or a mixed atmosphere of a rare gas and oxygen. As a target, a silicon oxide target or a silicon target can be used. For example, a silicon oxide layer can be formed by sputtering under an atmosphere containing oxygen with the use of silicon for the target.

In the case where an oxide semiconductor is used for the semiconductor layer 107, third heat treatment may be performed in a reduced pressure atmosphere, an inert gas atmosphere, an oxygen gas atmosphere, or an ultra-dry air (preferably at temperatures from 200° C. to 600° C., for example from 250° C. to 550° C.) after the insulating layer 111 is formed. For example, the third heat treatment may be performed at 450° C. for one hour in a nitrogen atmosphere. The third heat treatment is performed while part of the oxide semiconductor layer (the channel formation region) is in contact with the insulating layer 111. It is preferable that the above atmosphere do not contain water, hydrogen, or the like.

In the case where the semiconductor layer 107 is formed using an oxide semiconductor, when heat treatment is performed in a state where the semiconductor layer 107 is in contact with the insulating layer 111 containing oxygen, oxygen can be supplied to the semiconductor layer 107 from the insulating layer 111 containing oxygen. Note that the insulating layer 111 containing oxygen is preferably an insulating layer including a region that contains a larger amount of oxygen than the stoichiometric proportion.

The transistor 150 is formed through the above process. The protective insulating layer 112 may be further formed over the insulating layer 111. The protective insulating layer 112 is preferably formed using a material that hardly contains impurities such as moisture, a hydrogen ion, or OH⁻ and has a high barrier property against an alkali metal, hydrogen, and oxygen. Specifically, the protective insulating layer 112 is preferably formed using silicon nitride, silicon nitride oxide, aluminum nitride, aluminum oxide, aluminum oxynitride, or the like. In this embodiment, aluminum oxide is used for the protective insulating layer 112 (see FIG. 9C).

The protective insulating layer 112 is preferably provided in contact with the first gate insulating layer 102 or the base layer placed below the protective insulating layer 112, and prevents entry of impurities such as moisture, a hydrogen ion, or OH⁻ from the vicinity of the edge of the substrate. It is particularly effective to use silicon nitride or aluminum oxide for the first gate insulating layer 102 or the base layer, which is in contact with the protective insulating layer 112. In other words, when silicon nitride or aluminum oxide is provided so as to surround a lower surface, an upper surface, and a side surface of the oxide semiconductor layer, the reliability of the semiconductor device is improved.

After the transistor 150 is formed, heat treatment may be further performed at 100° C. to 200° C. for 1 to 30 hours in the air. This heat treatment may be performed at a fixed heating temperature. Alternatively, it is possible that the following change in temperature is set as one cycle and repeated plural times: the temperature is increased from room temperature to a heating temperature and then decreased to room temperature.

Alternatively, without performing the first heat treatment, the second heat treatment may be performed under the conditions of the first heat treatment.

Note that in the transistor 150, edges of the first control gate 101, the electrode 103, the source electrode 109a, and the drain electrode 109b are preferably tapered. Here, the taper angle is 30° to 60°, for example. Note that the taper angle refers to an inclination angle formed by a side surface and a bottom surface of a layer with a tapered shape when the layer is observed from the direction perpendicular to the cross section of the layer (i.e., the plane perpendicular to the surface of the substrate). When the edges of the first control gate 101, the electrode 103, the source electrode 109a, and the drain electrode 109b are tapered, coverage thereof with a layer formed in a later step can be improved and disconnection can be prevented.

Although the first control gate 101 and the semiconductor layer 107 in the top-gate transistor 170 are stacked in a different manner from those in the bottom-gate transistor 150, the transistor 170 can be formed using a material and a method similar to those of the transistor 150.

This embodiment can be implemented in combination with other embodiments as appropriate.

Embodiment 3

In this embodiment, application examples of the semiconductor device described in any of the above embodiments to an electronic device will be described with reference to FIGS. 10A to 10F. In this embodiment, a description is given of application examples of the above semiconductor device to electronic devices such as a computer, a mobile phone (also referred to as a cell phone or a mobile phone device), a personal digital assistant (including a portable game machine and an audio reproducing device), a camera such as a digital camera and a digital video camera, electronic paper, and a television device (also referred to as a television or a television receiver).

Figure 10A:
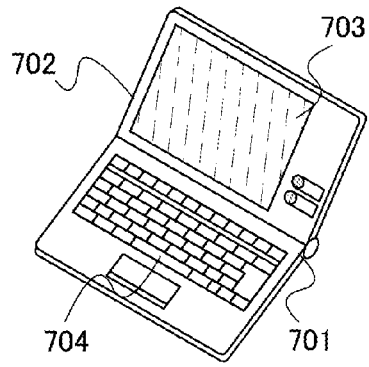
FIGS. 10A to 10F each illustrate an electronic device including a semiconductor device.

FIG. 10A illustrates a laptop personal computer that includes a housing 701, a housing 702, a display portion 703, a keyboard 704, and the like. The semiconductor device described in the above embodiment is provided in each of the housings 701 and 702. Thus, it is possible to provide a laptop personal computer in which data is written and read at high speed, data can be retained for a long time, and power consumption is sufficiently low.

Figure 10D:
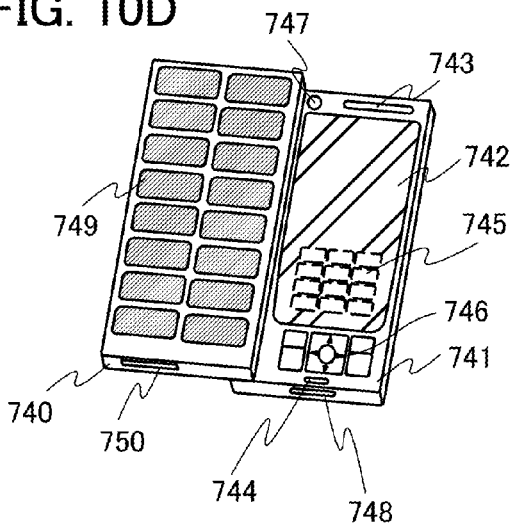
Figure 10B:
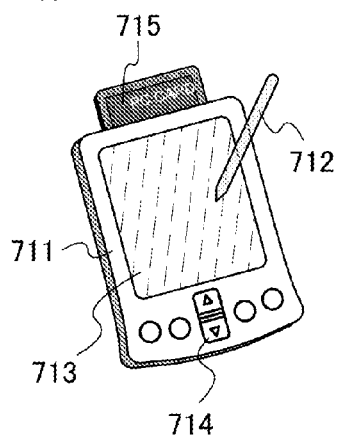

FIG. 10B illustrates a personal digital assistant (PDA). A main body 711 is provided with a display portion 713, an external interface 715, operation buttons 714, and the like. Further, a stylus 712 or the like for operating the personal digital assistant is provided. The semiconductor device described in the above embodiment is provided in the main body 711. Thus, it is possible to provide a personal digital assistant in which data is written and read at high speed, data can be retained for a long time, and power consumption is sufficiently low.

Figure 10E:
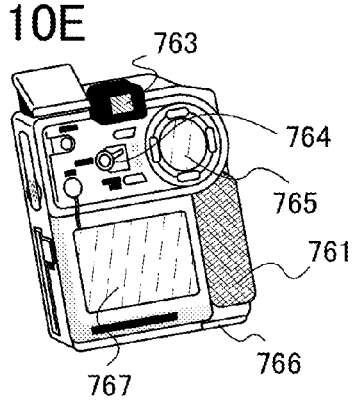
Figure 10C:
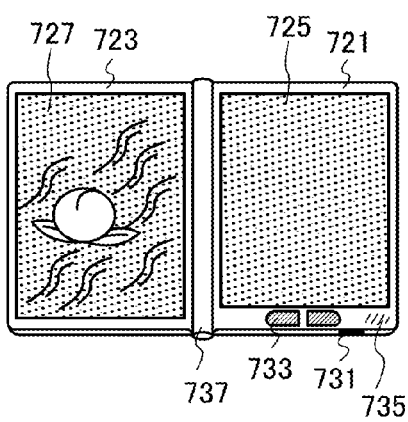

FIG. 10C illustrates an e-book reader including electronic paper, and the e-book reader includes two housings of a housing 721 and a housing 723. The housing 721 and the housing 723 are provided with a display portion 725 and a display portion 727, respectively. The housings 721 and 723 are connected by a hinge portion 737 and can be opened or closed with the hinge portion 737. The housing 721 is provided with a power switch 731, an operation key 733, a speaker 735, and the like. At least one of the housings 721 and 723 is provided with the semiconductor device described in the above embodiment. Thus, it is possible to provide an e-book reader in which data is written and read at high speed, data can be retained for a long time, and power consumption is sufficiently low.

FIG. 10D illustrates a mobile phone including two housings of a housing 740 and a housing 741. The housing 740 and the housing 741 developed as illustrated in FIG. 10D can shift by sliding so that one is lapped over the other; therefore, the size of the mobile phone can be reduced, which makes the mobile phone suitable for being carried. The housing 741 is provided with a display panel 742, a speaker 743, a microphone 744, a pointing device 746, a camera lens 747, an external connection terminal 748, and the like. The housing 740 is provided with a solar cell 749 for charging the mobile phone, an external memory slot 750, and the like. An antenna is incorporated in the housing 741.

The display panel 742 is provided with a touch panel. A plurality of operation keys 745 displayed as images are indicated by dashed lines in FIG. 10D. Note that the mobile phone includes a booster circuit for raising a voltage output from the solar cell 749 to a voltage needed for each circuit.

At least one of the housings 740 and 741 is provided with the semiconductor device described in the above embodiment. Thus, it is possible to provide a mobile phone in which data is written and read at high speed, data can be retained for a long time, and power consumption is sufficiently low.

FIG. 10E illustrates a digital camera that includes a main body 761, a display portion 767, an eyepiece 763, an operation switch 764, a display portion 765, a battery 766, and the like. The semiconductor device described in the above embodiment is provided in the main body 761. Thus, it is possible to provide a digital camera in which data is written and read at high speed, data can be retained for a long time, and power consumption is sufficiently low.

Figure 10F:
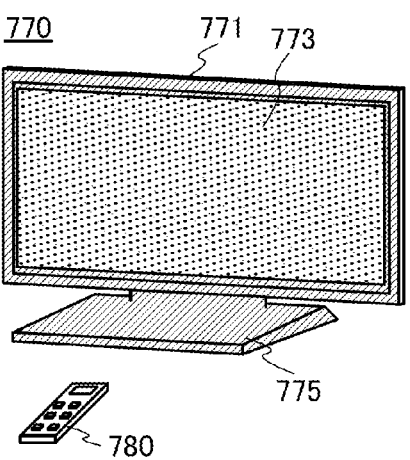

FIG. 10F illustrates a television device 770 including a housing 771, a display portion 773, a stand 775, and the like. The television device 770 can be operated with an operation switch of the housing 771 or a remote controller 780. The housing 771 and the remote controller 780 are each provided with the semiconductor device described in the above embodiment. Thus, it is possible to provide a television device in which data is written and read at high speed, data can be retained for a long time, and power consumption is sufficiently low.

As described above, the electronic devices described in this embodiment each include the semiconductor device described in any of the above embodiments; thus, electronic devices with low power consumption can be provided.

This embodiment can be implemented in combination with other embodiments as appropriate.

This application is based on Japanese Patent Application serial No. 2011-016957 filed with Japan Patent Office on Jan. 28, 2011, the entire contents of which are hereby incorporated by reference.

What is claimed is:

1. A semiconductor device comprising:
a transistor comprising a first gate, a second gate, a third gate, and a semiconductor layer including a channel formation region, the third gate including an oxide semiconductor; and
a wiring,
wherein the third gate includes a first region overlapping with the first gate and the channel formation region, and a second region extending beyond an edge of the first gate and overlapping with the second gate, and
wherein the second region of the third gate is electrically connected to the wiring.

2. The semiconductor device according to claim 1, wherein the wiring is a bit line.

3. The semiconductor device according to claim 1, wherein the semiconductor layer includes a crystalline semiconductor.

4. The semiconductor device according to claim 1, wherein the transistor is a p-channel transistor.

5. The semiconductor device according to claim 1, wherein the transistor is an n-channel transistor.

6. An electronic device comprising the semiconductor device according to claim 1.

7. The electronic device according to claim 6, wherein the electronic device has a function of a computer, a mobile phone, a personal digital assistant, a camera, electronic paper, or a television device.

8. A semiconductor device comprising:
a transistor comprising a first gate, a second gate, a third gate, and a semiconductor layer including a channel formation region, the third gate including an oxide semiconductor;
a first wiring;
a second wiring; and
a third wiring,
wherein the first gate is electrically connected to the first wiring,
wherein the second gate is electrically connected to the third wiring,
wherein one of source and drain of the transistor is electrically connected to the second wiring,
wherein the other of the source and the drain of the transistor is electrically connected to the third wiring,
wherein the third gate comprises a first region overlapping with the first gate and the channel formation region, and a second region extending beyond an edge of the first gate and overlapping with the second gate, and
wherein the second region of the third gate is electrically connected to the second wiring.

9. The semiconductor device according to claim 8, wherein the semiconductor layer includes a crystalline semiconductor.

10. The semiconductor device according to claim 8,
wherein the transistor is a p-channel transistor.

11. The semiconductor device according to claim 8,
wherein the transistor is an n-channel transistor.

12. An electronic device comprising the semiconductor device according to claim 8.

13. The electronic device according to claim 12,
wherein the electronic device has a function of a computer, a mobile phone, a personal digital assistant, a camera, electronic paper, or a television device.

14. A semiconductor device comprising:
a transistor comprising a first control gate, a second control gate, a storage gate, and a semiconductor layer including a channel formation region, the storage gate including an oxide semiconductor;
a control line;
a bit line; and
a word line,
wherein the first control gate is electrically connected to the control line,
wherein the second control gate is electrically connected to the word line,
wherein the storage gate is electrically connected to the bit line,
wherein one of source and drain of the transistor is electrically connected to the bit line,
wherein the other of the source and the drain of the transistor is electrically connected to the word line, and
wherein the storage gate comprises a first region overlapping with the first control gate and the channel formation region, and a second region extending beyond an edge of the first control gate and overlapping with the second control gate.

15. The semiconductor device according to claim 14,
wherein a part of the first control gate and a part of the second control gate overlap with each other with a part of the storage gate sandwiched therebetween.

16. The semiconductor device according to claim 15,
wherein the semiconductor layer includes a crystalline semiconductor.

17. The semiconductor device according to claim 15,
wherein the transistor is a p-channel transistor.

18. The semiconductor device according to claim 15,
wherein the transistor is an n-channel transistor.

19. An electronic device comprising the semiconductor device according to claim 15.

20. The electronic device according to claim 19,
wherein the electronic device has a function of a computer, a mobile phone, a personal digital assistant, a camera, electronic paper, or a television device.

21. A method for driving a semiconductor device,
the semiconductor device comprising:
a transistor comprising a first control gate, a second control gate, and a storage gate, the storage gate including an oxide semiconductor,
the method comprising the steps of:
setting a potential of the first control gate and a potential of the second control gate at a potential making the storage gate a conductor;
supplying a potential to be stored to the storage gate; and
setting at least one of the potential of the first control gate and the potential of the second control gate at a potential making the storage gate an insulator.

22. The method for driving a semiconductor device, according to claim 21,
wherein the potential to be stored to the storage gate is a potential turning off the transistor.

23. A method for driving a semiconductor device,
the semiconductor device comprising a transistor comprising a first control gate, a second control gate, and a storage gate, the storage gate including an oxide semiconductor,
the method comprising the steps of:
supplying a first potential to one of source and drain of the transistor,
supplying a second potential to the other of the source and the drain of the transistor; and
supplying a third potential to the first control gate to detect a potential change of the one of source and drain.

24. The method for driving a semiconductor device according to claim 23,
wherein a potential of the second control gate is a potential making at least part of the storage gate an insulator.

25. The method for driving a semiconductor device according to claim 23,
wherein the first potential is different from the second potential.

26. The method for driving a semiconductor device according to claim 23,
wherein the third potential is a negative potential.

* * * * *